(12) United States Patent
Cong et al.

(10) Patent No.: US 11,057,963 B2
(45) Date of Patent: Jul. 6, 2021

(54) LAMP INFRARED RADIATION PROFILE CONTROL BY LAMP FILAMENT DESIGN AND POSITIONING

(71) Applicant: Applied Materials, Inc., Santa Clara, CA (US)

(72) Inventors: Zhepeng Cong, Vancouver, WA (US); Schubert S. Chu, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 348 days.

(21) Appl. No.: 16/129,879

(22) Filed: Sep. 13, 2018

(65) Prior Publication Data

US 2019/0110336 A1  Apr. 11, 2019

Related U.S. Application Data

(60) Provisional application No. 62/569,210, filed on Oct. 6, 2017.

(51) Int. Cl.
| | |
|---|---|
| *H05B 3/00* | (2006.01) |
| *H01K 1/32* | (2006.01) |
| *H01L 21/67* | (2006.01) |
| *H01K 1/46* | (2006.01) |

(Continued)

(52) U.S. Cl.
CPC ............ *H05B 3/0047* (2013.01); *H01K 1/32* (2013.01); *H01K 1/46* (2013.01); *H01K 1/58* (2013.01); *H01K 7/00* (2013.01); *H01L 21/67115* (2013.01)

(58) Field of Classification Search
None
See application file for complete search history.

(56) References Cited

U.S. PATENT DOCUMENTS

| 3,784,861 A | 1/1974 | Notelteirs et al. |
| 4,965,485 A * | 10/1990 | Tarumi ................ H01K 1/32 313/43 |

(Continued)

FOREIGN PATENT DOCUMENTS

| TW | 568990 B | 1/2004 |
| WO | 2004-049405 A1 | 6/2004 |
| WO | 2016-071238 A1 | 5/2016 |

OTHER PUBLICATIONS

Office Action for Taiwan Application No. 107132389 dated Jan. 8, 2020.

(Continued)

*Primary Examiner* — Thor S Campbell
(74) *Attorney, Agent, or Firm* — Patterson + Sheridan, LLP

(57) ABSTRACT

Methods and apparatus disclosed herein generally relate to lamp heating of process chambers used to process semiconductor substrates. More specifically, implementations disclosed herein relate to arrangement and control of lamps for heating of semiconductor substrates. In some implementations of the present disclosure, fine-tuning of temperature control is achieved by dividing different lamps within an array of lamps into various subgroups or lamp assemblies defined by a specific characteristic. These various subgroups may be based on characteristics such as lamp design and/or lamp positioning within the processing chamber.

20 Claims, 10 Drawing Sheets

(51) Int. Cl.
*H01K 1/58* (2006.01)
*H01K 7/00* (2006.01)

(56) References Cited

U.S. PATENT DOCUMENTS

| | | | |
|---|---|---|---|
| 5,017,825 A * | 5/1991 | Heijnen | H01K 1/32 |
| | | | 313/111 |
| 5,111,105 A * | 5/1992 | Yamamoto | H01J 61/40 |
| | | | 313/112 |
| 5,478,639 A | 12/1995 | Kawaguchi et al. | |
| 5,857,764 A * | 1/1999 | Tabata | H01K 9/08 |
| | | | 362/214 |
| 6,099,148 A * | 8/2000 | Northrup | F21V 5/046 |
| | | | 362/336 |
| 6,108,491 A | 8/2000 | Anderson | |
| 7,398,693 B2 | 7/2008 | Ranish et al. | |
| 7,670,037 B2 * | 3/2010 | Devir | H01K 9/08 |
| | | | 362/464 |
| 8,203,257 B2 * | 6/2012 | Kuepper | H01K 1/26 |
| | | | 313/112 |
| 8,334,652 B2 | 12/2012 | Mueller et al. | |
| 8,513,626 B2 | 8/2013 | Ramachandran et al. | |
| 9,277,595 B2 | 3/2016 | Myo | |
| 9,396,925 B1 * | 7/2016 | Rice | H01K 1/32 |
| 9,536,728 B2 | 1/2017 | Ranish et al. | |
| 10,408,406 B1 * | 9/2019 | Rice | F21S 41/60 |
| 2002/0141191 A1 | 10/2002 | Li | |
| 2006/0066193 A1 * | 3/2006 | Ranish | H01L 21/67115 |
| | | | 313/116 |
| 2009/0009049 A1 * | 1/2009 | Behr | H01K 1/46 |
| | | | 313/318.02 |
| 2010/0117505 A1 * | 5/2010 | Reith | H01K 3/005 |
| | | | 313/113 |
| 2010/0308729 A1 | 12/2010 | Ramachandran | |
| 2013/0154466 A1 * | 6/2013 | Flechsig | H01J 61/40 |
| | | | 313/111 |
| 2013/0223824 A1 * | 8/2013 | Myo | H05B 3/0047 |
| | | | 392/411 |
| 2013/0287377 A1 | 10/2013 | Serebryanov et al. | |
| 2014/0265824 A1 | 9/2014 | Ranish | |
| 2014/0319120 A1 | 10/2014 | Brillhart et al. | |
| 2015/0071623 A1 | 3/2015 | Ranish | |
| 2016/0111305 A1 * | 4/2016 | Kumar | H01L 21/67115 |
| | | | 392/412 |
| 2016/0148798 A1 * | 5/2016 | Kowalski | F21S 41/60 |
| | | | 362/516 |
| 2016/0227606 A1 | 8/2016 | Samir et al. | |
| 2016/0234881 A1 | 8/2016 | Rao et al. | |
| 2018/0054856 A1 * | 2/2018 | Grob | H01K 1/18 |

OTHER PUBLICATIONS

Search Report for Taiwan Application No. 107132389 dated Dec. 23, 2019.
Office Action for Taiwan Application No. 107132389 dated Sep. 10, 2019.
Search Report for Taiwan Application No. 107132389 dated Aug. 20, 2019.
International Search Report and Written Opinion for International Application No. PCT/US2018/050912 dated Jan. 3, 2019.

* cited by examiner

LAMP INFRARED RADIATION PROFILE CONTROL BY LAMP FILAMENT DESIGN AND POSITIONING

CROSS-REFERENCE TO RELATED APPLICATIONS

This application claims benefit of U.S. Provisional Patent Application Ser. No. 62/569,210, filed Oct. 6, 2017, which is incorporated herein by reference in its entirety.

BACKGROUND

Field

Implementations disclosed herein generally relate to lamp heating in process chambers used to process semiconductor substrates. More specifically, implementations disclosed herein relate to arrangement and control of lamps for heating of semiconductor substrates.

Description of the Related Art

Several processes for the thermal processing of substrates such as semiconductor wafers and other materials involve rapidly heating and cooling a substrate. One example of such processing is rapid thermal processing (RTP), which is used in semiconductor device fabrication, for example, for post ion implant annealing.

In rapid thermal processing (RTP), heat energy radiates from radiation sources into the process chamber and to a semiconductor substrate in the processing chamber. In this manner, the substrate is rapidly heated to a processing temperature. During semiconductor processing operations, the radiation sources may operate at elevated temperatures. Not all of the radiant energy provided by the radiation sources actually heats the wafer. Some of the radiant energy, for example energy emitted from a point light source in directions other than the direction of the semiconductor substrate, is absorbed by the structural components of the chamber.

In addition, it is desirable to maintain a uniform temperature across the substrate during thermal processing thereof. A uniform temperature across the substrate enables uniform thermal processing of the substrate. Furthermore, temperature uniformity helps prevent thermal stress-induced substrate damage such as warping, defect generation, and slip.

During rapid thermal processing, lamps are often used as a radiation source, which heats a semiconductor substrate. The lamps are often arranged radially relative to the center of a lamphead containing the lamps. For example, a plurality of vertically extending lamps having a bulb extending towards the substrate from a lamp base can be arranged along various radii from a center of the lamphead. In another example, a plurality of horizontally extending lamps having a bulb extending parallel to or angled slightly towards the substrate can be arranged along various radii from a center of the lamphead. While these arrangements can provide adequate temperature control of radial locations on the substrates being processed, the temperature control around the different angular locations of the substrate still suffers from non-uniformity. One attempt to provide fine temperature control involves the use a honeycomb arrangement having hundreds or even thousands of lamps, but having hundreds or thousands of lamps is not a cost-effective solution.

Therefore, there is a need for an improved design for lamp heating in semiconductor process chambers.

SUMMARY

Implementations disclosed herein generally relate to lamp heating of process chambers used to process semiconductor substrates. More specifically, implementations disclosed herein relate to arrangement and control of lamps for heating of semiconductor substrates. In one implementation, an apparatus operable to heat a substrate in a processing chamber is provided. The apparatus comprise a first lamp module. The first lamp module comprises two or more lamp assemblies operable to provide radiant energy to heat a substrate. The two or more lamp assemblies comprise a first lamp assembly and a second lamp assembly. The first lamp assembly comprises a first plurality of lamps. Each lamp of the first plurality of lamps comprises a first envelope having a first end and a second end, a base coupled with the first end of the first envelope to support the first envelope, and a first filament positioned along a longitudinal axis extending from the first end to the second end. Each lamp of the first plurality of lamps has at least one characteristic of the following set of characteristics: the first filament has a first length, an end of the first filament is positioned a first distance from the first end, the first filament has a first number of coils, and the first envelope includes an opaque portion positioned a second distance from the first end. The second lamp assembly comprises a second plurality of lamps. Each lamp of the second plurality of lamps comprises a second envelope having a first end and a second end, a base coupled with the first end of the second envelope to support the second envelope, and a second filament positioned along a longitudinal axis extending from the first end to the second end. Each lamp of the second plurality of lamps has at least one characteristic of the following set of characteristics: the second filament has a second length, the end of the second filament is positioned a third distance from the first end, the second filament has a second number of coils, and the second envelope includes an opaque portion positioned a fourth distance from the first end.

In another implementation, an apparatus operable to heat a substrate is provided. The apparatus comprises a processing chamber. The processing chamber comprises a sidewall defining a processing region and a first lamp module external to the processing region. The first lamp module comprises two or more lamp assemblies operable to provide radiant energy to heat a substrate when disposed in the processing region. The first lamp module comprises a first lamp assembly and a second lamp assembly. The first lamp assembly comprises a first plurality of lamps and a first power source coupled with the first plurality of lamps. Each lamp of the first plurality of lamps comprises a first envelope having a first end and a second end, a base coupled with the first end of the first envelope to support the first envelope, and a first filament positioned along a longitudinal axis extending from the first end to the second end. Each lamp of the first plurality of lamps has at least one characteristic of the following set of characteristics: the first filament has a first length, an end of the first filament is positioned a first distance from the first end, the first filament has a first number of coils, and the first envelope includes an opaque portion positioned a second distance from the first end. The second lamp assembly comprises a second plurality of lamps and a second power source coupled with the second plurality of lamps. Each lamp of the second plurality of lamps comprises a second envelope having a first end and a second end, a base coupled with the first end of the second envelope to support the second envelope, and a second filament positioned along a longitudinal axis extending from the first end to the second end. Each lamp of the second plurality of lamps has at least one characteristic of the following set of characteristics: the second filament has a second length, the end of the second filament is positioned a third distance from the first end, the second filament has a second number of coils, and the second envelope includes an opaque portion positioned a fourth distance from the first end, wherein at least one of the characteristics of the first plurality of lamps differs from at least one of the characteristics of the second plurality of lamps. The processing chamber further comprises a divider positioned between the first lamp module and the processing region.

In yet another implementation, an apparatus operable to heat a substrate is provided. The apparatus comprises a processing chamber. The processing chamber comprises a sidewall defining a processing region and a first lamp module external to the processing region. The first lamp module comprises two or more lamp assemblies operable to provide radiant energy to heat a substrate when disposed in the processing region. The two or more lamp assemblies comprise a first lamp assembly and a second lamp assembly. The first lamp assembly comprises a first plurality of lamps and a first power source coupled with the first plurality of lamps. Each lamp of the first plurality of lamps comprises a first envelope having a first end and a second end, a base coupled with the first end of the first envelope to support the first envelope, and a first filament positioned along a longitudinal axis extending from the first end to the second end. Each lamp of the first plurality of lamps has at least one characteristic of the following set of characteristics: the first filament has a first length, an end of the first filament is positioned a first distance from the first end and the first filament has a first number of coils. The two or more lamp assemblies comprise a second lamp assembly. The second lamp assembly comprises a second plurality of lamps and a second power source coupled with the second plurality of lamps. Each lamp of the second plurality of lamps comprises a second envelope having a first end and a second end, a base coupled with the first end of the second envelope to support the second envelope, and a second filament positioned along a longitudinal axis extending from the first end to the second end. Each lamp of the second plurality of lamps has at least one characteristic of the following set of characteristics: the second filament has a second length, the end of the second filament is positioned a third distance from the first end and the second filament has a second number of coils. The processing chamber further comprises a divider positioned between the first lamp module and the processing region, wherein the first number of coils is greater than the second number of coils.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
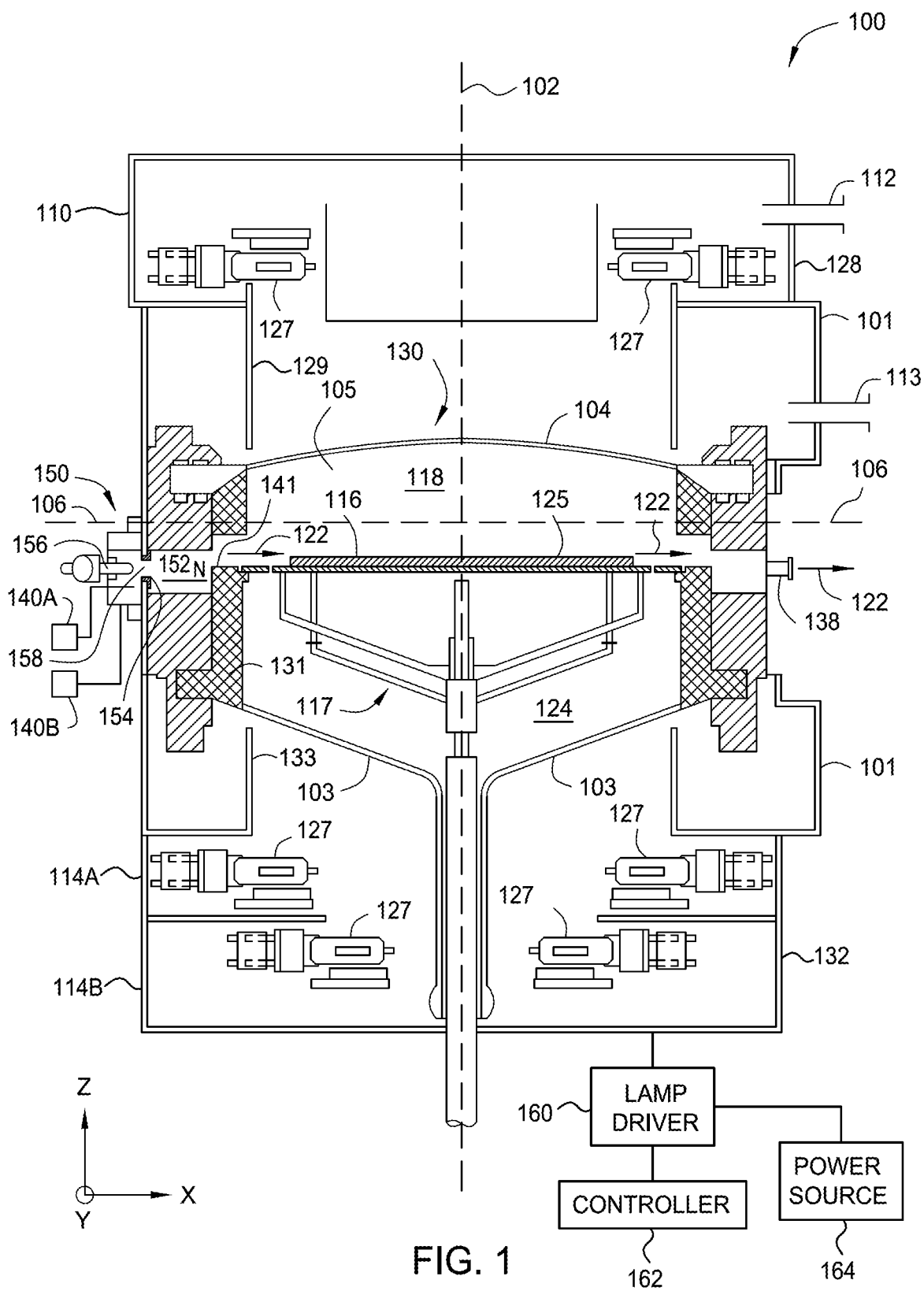
FIG. 1 is a schematic cross-sectional view of one implementation of a thermal processing chamber including an annular lamp array in accordance with one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes radiation sources and thermal processing using the radiation sources as a source of heat energy. Certain details are set forth in the following description and in FIGS. 1-12 to provide a thorough understanding of various implementations of the disclosure. Other details describing well-known structures and systems often associated with radiation sources and thermal processing are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

While the particular apparatus in which the implementations described herein can be practiced is not limited, it is particularly beneficial to practice the implementations in thermal processing systems such as the RADIANCE® RTP system, RADIANCEPLUS™ RTP system, VULCAN™ RTP system; in deposition systems such as the RP EPI system; on platforms such as the CENTURA® platform, ENDURA® platform, and the VANTAGE® platform all available from Applied Materials, Inc., Santa Clara, Calif. Additionally, thermal processing systems and deposition systems available from other manufacturers may also benefit from implementations described herein. The processing chambers depicted in FIG. 1, FIG. 10, FIG. 11A and FIG. 12 are illustrative only and the present inventive methods may be used to advantage in other processing chambers as well, including those configured for processes other than epitaxial deposition processes.

In the semiconductor industry, it is desirable to maintain temperature uniformity across the substrate during thermal processing. Temperature uniformity enables uniform processing of the substrate during thermal processes such as film deposition, oxide growth, and etching. Furthermore, temperature uniformity helps prevent thermal stress-induced substrate damage such as warping, defect generation, and slip. During rapid thermal processing, lamps are often used as radiation sources to heat the semiconductor substrates during processing. These lamps are often arranged in various arrays (e.g., linear or annular). While current lamp arrangements provide adequate temperature control of radial locations on the substrates being processed, the temperature control around the different angular locations of the substrate still suffers from non-uniformity. Thus, there is a need for methods and apparatus to fine tune temperature control within thermal processing chambers.

Modifying current lamphead modules and reflectors presents significant engineering challenges and is likely cost prohibitive. Some implementations of the present disclosure provide methods and apparatus for fine tuning temperature control within a thermal processing chamber without significant redesign of current chamber hardware, which increases substrate throughput while reducing the overall cost of ownership. In some implementations of the present disclosure, fine-tuning of temperature control is achieved by segregating different lamps within an array of lamps into various subgroups or lamp assemblies, based on a specific characteristic thereof. The selection criteria for subgroups of lamps may be based on characteristics such as lamp design and/or lamp positioning within the processing chamber. For example, various lamp designs and/or positioning may be used to vary filament position relative to a chamber component such as the reflectors of the chamber. Examples of characteristics based on lamp design include, but are not limited to, the size of the filament within each lamp, the angle of the filament within each lamp, the number of turns of the filament helix within each lamp, the position of the filament within each lamp, and/or the location of one or more heat shields on different section of the lamp envelope, which encloses the filament. Examples of characteristics based on lamp positioning include but are not limited to modifying a lamp socket to affect the position of the lamp, modifying the lamp socket to affect the tilt, e.g., an angle with respect to a ray perpendicular to the substrate support, of each lamp filament, and/or positioning one or more lamps on a movable stage with an optional tilt mechanism. The lamps sharing a selected characteristic can be divided into subgroups or lamp assemblies within an array that form a lamp string (e.g., lamp zones formed by strings of 1-5 lamps in series or parallel). Each lamp string can be controlled with an individual electric driving circuit in order to introduce a targeted infrared radiation profile tuning range at the substrate.

FIG. 1 is a schematic cross-sectional view of a deposition chamber 100, according to one or more implementations described herein. In one implementation, the deposition chamber 100 is a chemical vapor deposition (CVD) or epitaxial deposition chamber. The deposition chamber 100 includes an annular array of lamps that may benefit from the implementations disclosed herein. The deposition chamber 100 includes housing structure 101 made of a process resistant material, such as aluminum or stainless steel, for example 316 L stainless steel. The housing structure 101 encloses various functioning elements of the deposition chamber 100, such as a chamber 130, which may be quartz, and which includes an upper chamber volume 105, and a lower chamber volume 124, which together provide a processing volume 118. Reactive species are provided to the chamber 130 by a gas distribution assembly 150, and processing byproducts are removed from the processing volume 118 by an outlet port 138, which is typically in communication with a vacuum source (not shown).

A substrate support 117 is adapted to receive a substrate 125 that is transferred to the processing volume 118. The substrate support 117 is disposed along, and generally perpendicular to, a longitudinal axis 102 of the deposition chamber 100. The substrate support, which may be a susceptor, is made of a process resistant material such as ceramic, silicon carbide, or a graphite material coated with a silicon material, such as silicon carbide. Reactive species from precursor reactant materials are applied to a surface 116 of the substrate 125, and byproducts may be subsequently removed from the surface 116.

Heating of the substrate 125 and/or the processing volume 118 may be provided by radiation sources, such as an upper lamp module 110 and lower lamp modules 114A, 114B. The upper lamp module 110 and the lower lamp modules 114A, 114B are positioned adjacent to an upper divider 104 and a lower divider 103 respectively. Each of the dividers 103 and 104 may be a window, and each of the dividers 103 and 104 may be made of quartz. The lower lamp module 114A includes an outer array of lamps 127. The lower lamp module 114B includes an inner array of lamps 127. The lamps 127 in each of the lower lamp modules 114A, 114B, and the upper lamp module 110 may be any type of lamps suitable for semiconductor processing, for example, such as 2 kW lamps, 3 kW lamps, or the like. The lamps 127 in each of the lower lamp modules 114A, 114B, and the upper lamp module 110 are here arranged in an annular array design. The lamps 127 within each array are here divided into separately controllable subgroups or lamp assemblies as described herein.

The upper lamp module 110 includes a peripheral reflector structure 128, which provides for mechanical attachment of each lamp 127 with respect to the processing volume 118 as well as a reflective surface 129 to enhance directivity, distribution, or placement of radiation generated by each lamp 127. The lower lamp modules 114A, 114B also include a peripheral reflector structure 132, which provides for mechanical attachment of each lamp 127 with respect to the processing volume 118 as well as a reflective surface 133 to enhance directivity of radiation generated by each lamp 127. For the deposition chamber 100 of FIG. 1, the peripheral reflector structure 128 and the peripheral reflector structure 132 may be formed from a rigid, thermally durable material such as aluminum or brass. Additionally, the reflective surfaces 129, 133 may be coated with a material having good reflective qualities for infrared radiation emitted by the lamps such as gold or copper.

In one implementation, the upper lamp module 110 and the lower lamp modules 114A, 114B include infrared (IR) lamps. Non-thermal energy or radiation from the upper lamp module 110 and the lower lamp modules 114A, 114B travels through the upper divider 104 of the upper chamber volume 105, and through the lower divider 103 of the lower chamber volume 124. During processing, the substrate 125 is disposed on the substrate support 117. The upper lamp module 110 and the lower lamp modules 114A, 114B are sources of infrared (IR) radiation (e.g., radiant heat) and, in operation, generate a pre-determined temperature distribution across the substrate 125. Each of the lamp modules 110, 114A, and 114B may be divided into one or more lamp assemblies, where each lamp in a lamp assembly shares a specified characteristic.

The deposition chamber 100 further comprises one or more lamp drivers 160 to power the lamps of the lamp assemblies, a controller 162 for controlling the operation of the lamp driver, and one or more power sources 164 for powering the lamps in each lamp assembly via the one or more lamp drivers 160. The one or more lamp drivers 160 here transform AC power to DC power and step down the voltage of the DC power. The one or more lamp drivers 160 distribute the stepped-down power to a specified lamp assembly within each of the lamp modules 110, 114A, 114B. The configuration of the one or more lamp drivers 160 can vary dependent upon the type of lamp used. Although only one lamp driver 160 is shown, any number of lamp drivers ($160_1 \ldots 160_n$), each corresponding to a lamp assembly or subgroup of lamps, which may be a subset of the lamps in a lamp assembly, in each of the lamp modules 110, 114A, and 114B, may be provided. In some implementations, the lamp driver includes at least one of a rectifier coupled with the AC power source to convert the AC input waveform to DC voltage and a direct-current to direct-current (DC/DC) converter to reduce the voltage of the DC power. The one or more power sources 164 are an alternating current (AC) power source to produce an AC input waveform or a direct current (DC) power source.

Cooling gases for the upper chamber volume 105, if needed, enter through an inlet port 112 and exit through an outlet port 113 of the reflector structure. Precursor reactant materials, as well as diluent, purge and vent gases for the deposition chamber 100, enter processing volume 118 through the gas distribution assembly 150 and exit therefrom through the outlet port 138. While the upper divider 104 is shown as being curved or convex, the upper divider 104 may be planar or concave.

The radiation in the processing volume 118, which is used to energize reactive species and assist in adsorption of reactants and desorption of process byproducts from the surface 116 of the substrate 125, typically ranges from about 0.8 μm to about 1.2 μm, for example, between about 0.95 μm to about 1.05 μm, with combinations of various wavelengths being provided, depending, for example, on the composition of the film which is being grown epitaxially.

The component gases enter the processing volume 118 via the gas distribution assembly 150. Gas flows from the gas distribution assembly 150 and exits through the outlet port 138 via a flow path as shown generally by arrow 122. Combinations of component gases, which are used to clean/passivate a substrate surface, or to form the silicon and/or germanium-containing film that is being epitaxially grown, are typically mixed prior to entry into the processing volume. The overall pressure in the processing volume 118 may be adjusted by a valve (not shown) on the outlet port 138, which is pumped by a vacuum pump. At least a portion of the interior surface of the processing volume 118 is covered by a liner 131. In one implementation, the liner 131 comprises a quartz material that is opaque. In this manner, the chamber wall is insulated from the heat in the processing volume 118.

The temperature of surfaces in the processing volume 118 may be controlled within a temperature range of about 200° C. to about 600° C., or greater, by the flow of a cooling gas, which enters through the inlet port 112 and exits through the outlet port 113, in combination with radiation from the upper lamp module 110 positioned above the upper divider 104. The temperature in the lower chamber volume 124 may be controlled within a temperature range of about 200° C. to about 600° C. or greater, by adjusting the speed of a blower unit, which is not shown, and by radiation from the lower lamp modules 114A, 114B disposed below the lower chamber volume 124. The pressure in the processing volume 118 may be between about 0.1 Torr to about 600 Torr, such as between about 5 Torr to about 30 Torr.

The temperature on the exposed surface 116 of the substrate 125 may be controlled by power adjustment to the lower lamp modules 114A, 114B in the lower chamber volume 124, or by power adjustment to both the upper lamp modules 110 overlying the upper chamber volume 105, and the lower lamp modules 114A, 114B in the lower chamber volume 124. The power density in the processing volume 118 may be between about 40 W/cm$^2$ to about 400 W/cm$^2$, such as about 80 W/cm$^2$ to about 120 W/cm$^2$.

In one implementation, the gas distribution assembly 150 is disposed normal to, or in a radial direction 106 relative to, the longitudinal axis 102 of the deposition chamber 100 or the substrate 125. In this orientation, the gas distribution assembly 150 is adapted to flow process gases in a radial direction 106 across, or parallel to, the surface 116 of the substrate 125. In one processing application, the process gases are preheated at the point of introduction to the deposition chamber 100 to initiate preheating of the gases prior to introduction to the processing volume 118, and/or to break specific bonds in the gases. In this manner, surface reaction kinetics may be modified independently from the thermal temperature of the substrate 125.

In operation, precursors to form Si and SiGe blanket or selective films are provided to the gas distribution assembly 150 from one or more gas sources 140A and 140B. IR lamps 156 (only one is shown in FIG. 1) may be utilized to heat the precursors within the gas distribution assembly 150 as well as along the flow path shown by arrow 122. The gas sources 140A, 140B may be coupled to the gas distribution assembly 150 in a manner configured to facilitate introduction zones within the gas distribution assembly 150, such as a radial outer zone to introduce gas over the outer circumferential portion thereof and a radial inner zone between the outer zones when viewed in from a top plan view, to introduce gas directed toward the center of the substrate. The gas sources 140A, 140B may include valves (not shown) to control the rate of introduction into the zones.

The gas sources 140A, 140B may include silicon precursors such as silanes, including silane ($SiH_4$), disilane ($Si_2H_6$), dichlorosilane ($SiH_2Cl_2$), hexachlorodisilane ($Si_2Cl_6$), dibromosilane ($SiH_2Br_2$), higher order silanes, derivatives thereof, and combinations thereof. The gas sources 140A, 140B may also include germanium-containing precursors, such as germane ($GeH_4$), digermane ($Ge_2H_6$), germanium tetrachloride ($GeCl_4$), dichlorogermane ($GeH_2Cl_2$), derivatives thereof, and combinations thereof. The silicon and/or germanium containing precursors may be used in combination with hydrogen chloride (HCl), chlorine gas ($Cl_2$), hydrogen bromide (HBr), and combinations thereof. The gas sources 140A, 140B may include one or more of the silicon and germanium containing precursors in one or both of the gas sources 140A, 140B.

The precursor materials enter the processing volume 118 through openings or a plurality of holes 158 (only one is shown in FIG. 1) in a perforated plate 154 in this excited state, which in one implementation is a quartz material, having the holes 158 formed therethrough. The perforated plate 154 is substantially transparent to IR energy, and may be made of a clear quartz material. In other implementations, the perforated plate 154 may be any material that is substantially transparent to IR energy and is resistant to process chemistry and other process chemistries. The energized precursor materials flow toward the processing volume 118 through the plurality of holes 158 in the perforated plate 154, and through a plurality of channels 152 (only one is shown in FIG. 1). A portion of the photons and non-thermal energy from the IR lamps 156 also passes through the holes 158, the perforated plate 154, and the plurality of channels 152 facilitated by a reflective material and/or surface disposed on the interior surfaces of the gas distribution assembly 150, thus intersecting with the flow path of the precursor materials as shown by arrow 122. In this manner, the vibrational energy of the precursor materials may be maintained from the point of introduction to the processing volume 118 along the flow path.

Figure 2:
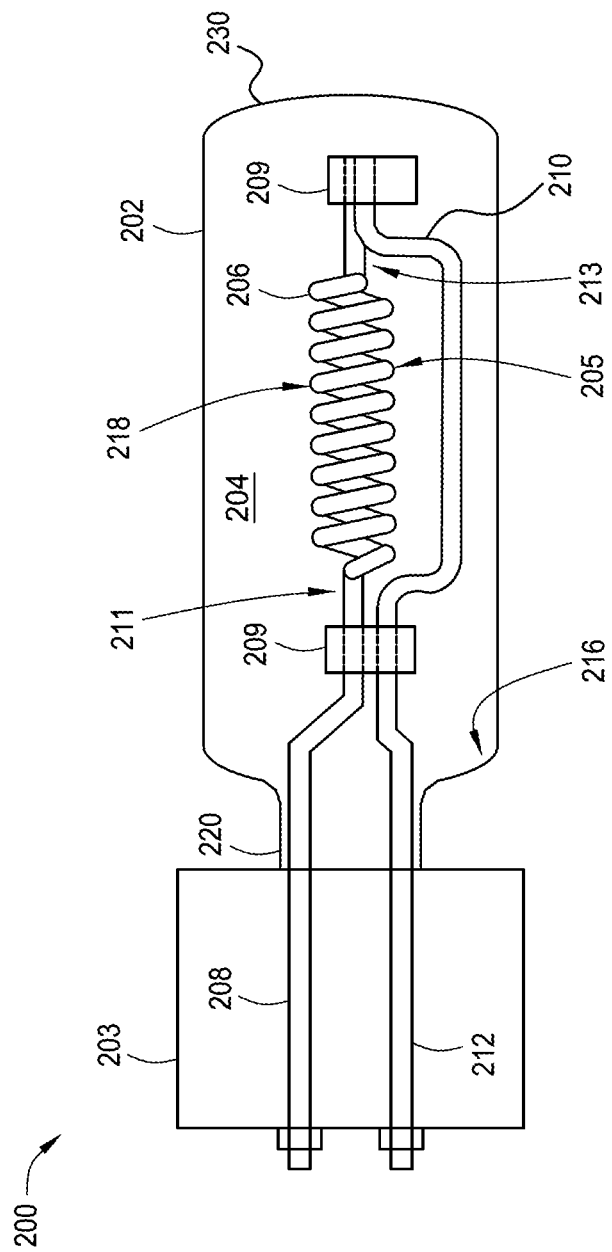
FIG. 2 is a schematic view of a lamp in accordance with one or more implementations of the present disclosure.

FIG. 2 is a schematic view of one example of a lamp 200 in accordance with one or more implementations of the present disclosure. In one implementation, the lamp 200 is an infrared (IR) lamp. The lamp 200 may be used in place of any of the lamps described herein. The lamp 200 may generally comprise a lamp envelope 202 having interior volume 204. The lamp envelope 202 may be formed of a transparent or semi-transparent material, such as quartz, glass, or other suitable materials. The lamp envelope 202 has a first end 220 coupled with a base 203 and a second end 230 opposing the first end 220.

A filament 206 is disposed within the interior volume 204 to provide heat energy when electric current is provided to the filament 206 of the lamp 200. The filament 206 includes a main body 205 disposed between a first end 211 and a second end 213 of the filament 206. The filament 206 is coupled at the first end 211 to a first conductor 208. In some implementations, the filament 206 may be supported by one or more support structures (not shown) which extend from one or more support bases 209 disposed within the interior volume 204. In some implementations, a first interceptor bar 210, which is conductive, is disposed within the lamp envelope 202 beneath the filament 206. As used, herein, beneath means both directly beneath or at an angle to (e.g., below and to a side of) the filament 206, so long as the filament may contact the first interceptor bar 210 when sagging to a sufficient degree during use or over time, and is not intended to limit orientation of the lamp 200. The first interceptor bar 210 may be coupled between the second end 213 of the filament 206 and a second conductor 212. During typical operation, current flows into the lamp via the first conductor 208, through the filament 206, along the first interceptor bar 210, and exits the lamp via the second conductor 212.

In some implementations, the filament 206 comprises a tightly coiled wire that is then wrapped into a plurality of coils 218. The plurality of coils 218 may form the main body 205 of the filament 206. However, other configurations of the filament are possible, such as loops, helices, or other suitable coil-like configurations. An increased length, and current path, of the filament, by for example, providing coils 218 and secondary coils (not shown), can increase resistance through the filament 206, which can allow the lamp to operate at lower currents. The filament 206 may be formed of tungsten (W) or another suitable filament material.

In some implementations, the interior volume 204 may be filled with an inert gas, for example, argon, helium, or the like, and further with a halogen gas, such as bromine or hydrogen bromide. When present, during use of the lamp 200, the halogen gas may prevent deposition of the filament material on interior surfaces 216 of the lamp envelope 202 by facilitating re-deposition of the filament material on the filament 206.

The lamp 200 may further include the base 203 having the first and second conductors 208, 212 disposed therethrough. The base 203 may provide support to the lamp 200, such as by being held in a socket assembly or other similar structure. The base 203 may be fabricated from any non-conductive material suitable to provide support to the lamp, for example a ceramic such as aluminum oxide ($Al_2O_3$) or the like.

Figure 3:
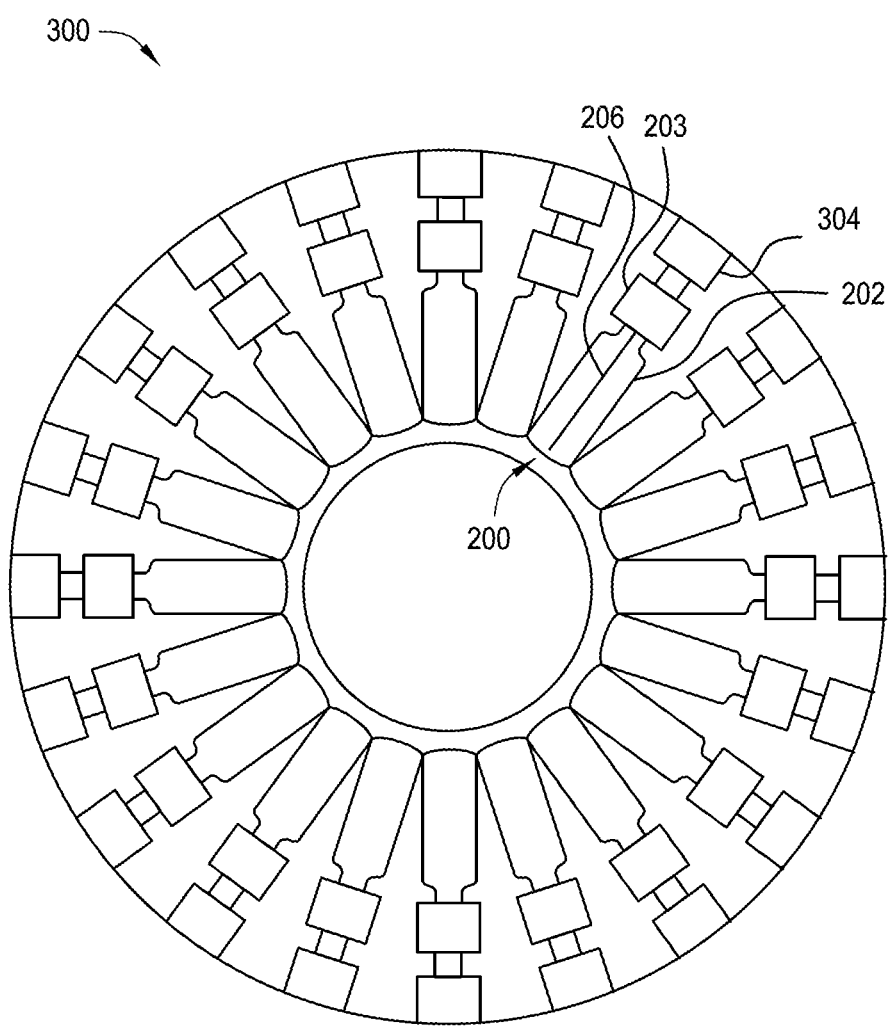
FIG. 3 is a top view of an annular lamp array in accordance with one or more implementations of the present disclosure.

FIG. 3 is a top view of an annular lamp array 300 in accordance with one or more implementations of the present disclosure. In some implementations, one or more lamps (e.g., lamps in modules 110, 114A, 114B described above) are arranged or configured in any manner suitable to provide a targeted temperature profile within a process chamber (e.g., deposition chamber 100 described above) to facilitate a process within the deposition chamber. For example, in some implementations, one or more of a group of the lamps in the upper lamp module 110 or the lower lamp modules 114A, 114B are arranged in an array, for example, such as the annular array as depicted in FIG. 3. In such implementations, each lamp 200 of the annular lamp array 300 of lamps is coupled with a respective socket 304 to provide power to the lamp 200. The socket 304 is supported by, or coupled with, any portion of the process chamber, for example such as the peripheral reflector structure 128 or the peripheral reflector structure 132 described above, or in any other suitable location to position the lamps as chosen to facilitate providing the heat energy from the lamps to the process chamber during use. The lamps 200 within the array are divided into separately controllable lamp assemblies or subgroups as further described herein.

Figure 4:
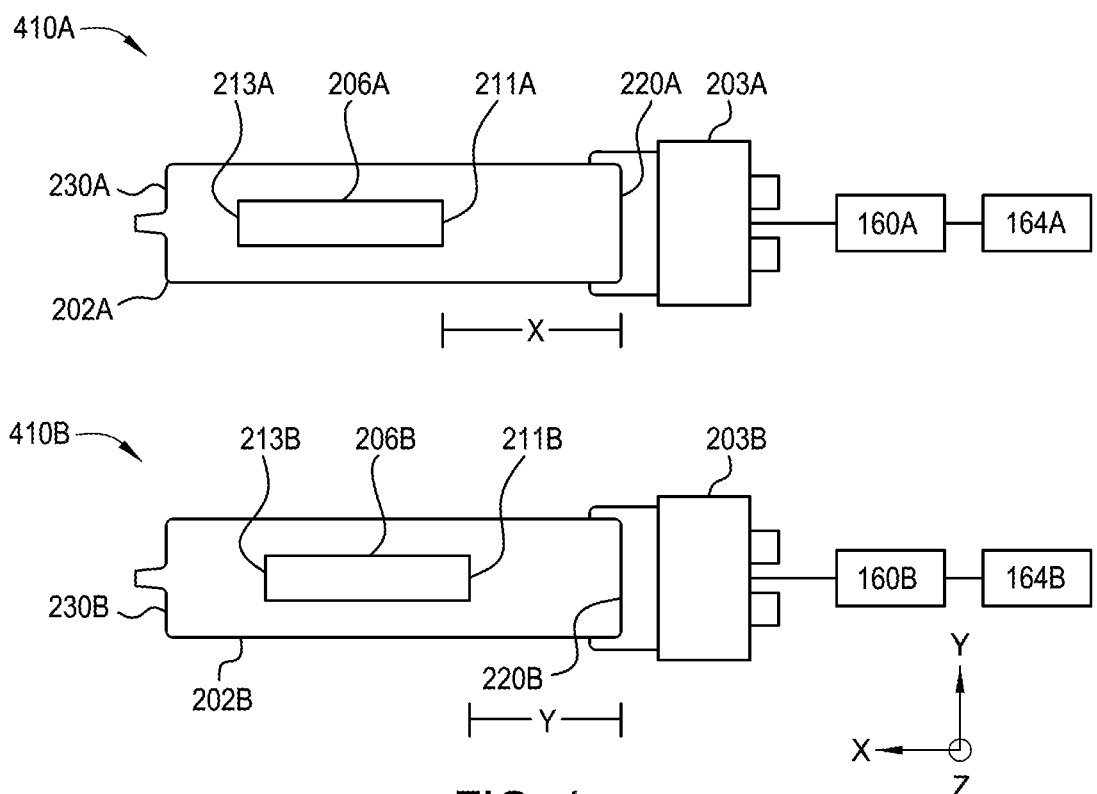
FIG. 4 is a schematic view of a pair of lamps in accordance with one or more implementations of the present disclosure.

FIG. 4 is a schematic view of a pair of lamps 410A, 410B in accordance with one or more implementations of the present disclosure. The lamps 410A, 410B may be similar to lamp 200 depicted in FIG. 2. The filament design and position in lamps 410A, 410B may be used in linear lamps, for example linear lamp(s) 1115 described in FIG. 11A and FIG. 11B. In one implementation, the lamps 410A, 410B are infrared (IR) lamps. Each of the pair of lamps 410A, 410B may be used with any of the implementations described herein. The lamp 410A may be included in a first lamp assembly or first subgroup of lamps, where the lamps within the first lamp assembly share a common characteristic such as the position of the filament within the lamp. The lamp 410A may be connected to a first lamp driver 160A and a first power source 164A. In one implementation, the lamp 410A is connected in series or in parallel with other lamps in the same lamp assembly. The lamp 410B may be included in a second lamp assembly or second subgroup of lamps, where the lamps within the second lamp assembly share a common characteristic such as the position of the filament within the lamp, wherein the position of the filament within the lamp 410A is different from the position of the filament within lamp 410B. The lamp 410B may be connected to a second lamp driver 160B and a second power source 164B. In one implementation, the lamp 410B is connected in series or in parallel with other lamps in the same lamp assembly.

The lamp 410A includes a lamp envelope 202A, having a first end 220A coupled with base 203A and a second end 230A distal therefrom. The lamp 410A further includes a filament 206A (shown schematically) having a first end 211A and a second end 213A distal therefrom. The lamp 410B includes a lamp envelope 202B, having a first end 220B coupled with base 203B and a second end 230B distal therefrom. The lamp 410B further includes a filament 206B (shown schematically) having a first end 211B and a second end 213B distal therefrom. As depicted in FIG. 4, the first end 211A of the filament 206A is positioned a first distance "x" from the first end 220A of the lamp envelope 202A and the first end 211B of the filament 206B is positioned a first distance "y" from the first end 220B of the lamp envelope 202B, wherein the first distance "x" is greater than the second distance "y." Thus, the filaments 206A, 206B are located at different positions within their respective lamp envelopes 202A, 202B.

Figure 5:
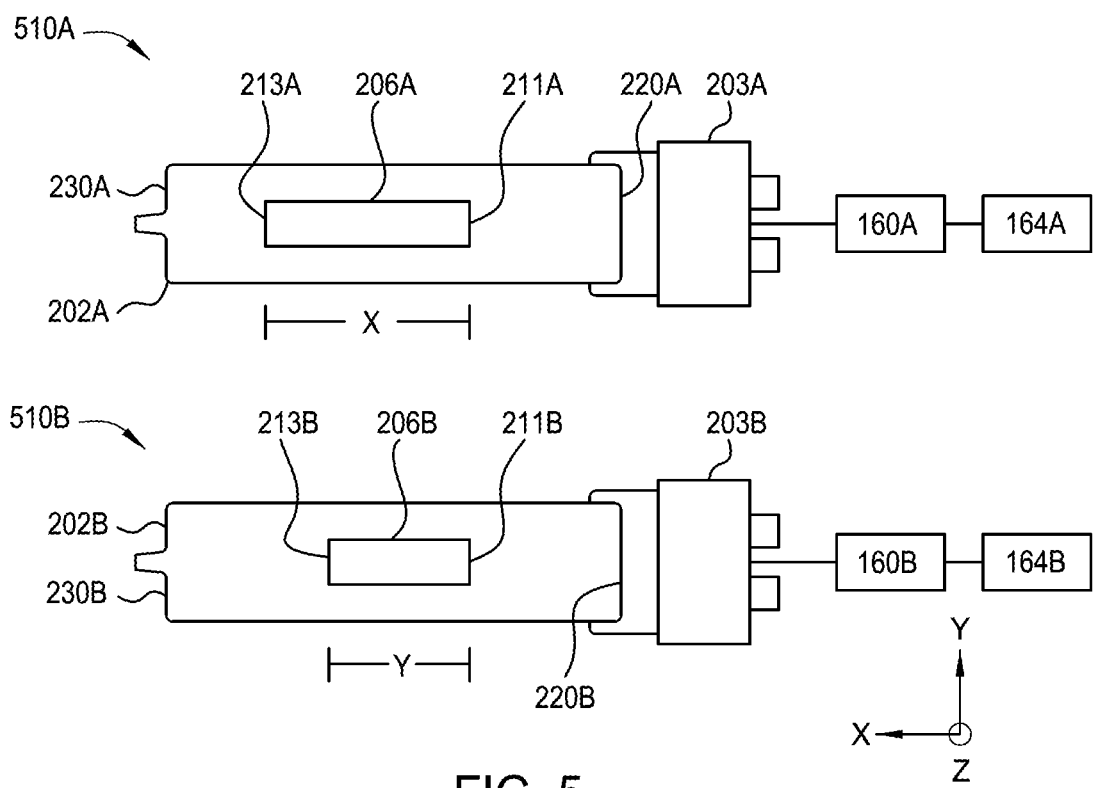
FIG. 5 is a schematic view of another pair of lamps in accordance with one or more implementations of the present disclosure.

FIG. 5 is a schematic view of another pair of lamps 510A, 510B in accordance with one or more implementations of the present disclosure. Each of the pair of lamps 510A, 510B may be used with any of the implementations described herein. The lamps 510A, 510B may be similar to lamp 200 depicted in FIG. 2. The filament design and position in lamps 510A, 510B may be used in linear lamps, for example linear lamp(s) 1115 described in FIG. 11A and FIG. 11B. In one implementation, the lamps 510A, 510B are infrared (IR) lamps. The lamp 510A may be included in a first lamp assembly or first subgroup of lamps, where the lamps within the first lamp assembly share a common characteristic such as the length of the filament within the lamp. The lamp 510A may be connected to a first lamp driver 160A and a first power source 164A. In one implementation, the lamp 510A is connected in series or in parallel with other lamps in the same lamp assembly. The lamp 510B may be included in a second lamp assembly or second subgroup of lamps, where the lamps within the second lamp assembly share a common characteristic such as the length of the filament within the lamp, wherein the length of the filament within the lamp 510A is different from the length of the filament within the lamp 510B. The lamp 510B may be connected to a second lamp driver 160B and a second power source 164B. In one implementation, the lamp 510B is connected in series or in parallel with other lamps in the same lamp assembly.

As depicted in FIG. 5, the filament 206A (shown schematically) of lamp 510A has a first length "x." The filament 206B (shown schematically) of lamp 510B has a second length "y." The first length "x" is greater than the second length "y."

Figure 6:
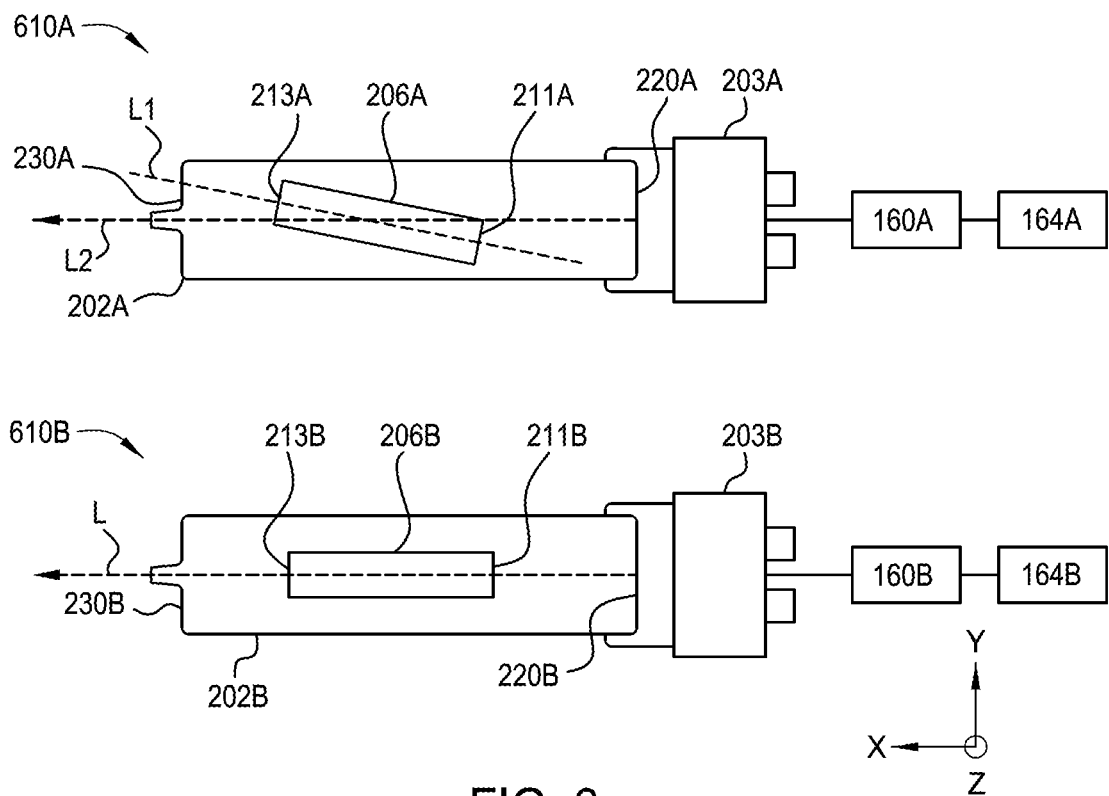
FIG. 6 is a schematic view of another pair of lamps in accordance with one or more implementations of the present disclosure.

FIG. 6 is a schematic view of another pair of lamps in accordance with one or more implementations of the present disclosure. The lamps 610A, 610B may be similar to lamp 200 depicted in FIG. 2. The filament design and position in lamps 610A, 610B may be used in linear lamps, for example linear lamp(s) 1115 described in FIG. 11A and FIG. 11B. In one implementation, the lamps 610A, 610B are infrared (IR) lamps. Each of the pair of lamps 610A, 610B may be used with any of the implementations described herein. The lamp 610A may be included in a first lamp assembly or first subgroup of lamps, where the lamps within the first lamp assembly share a common characteristic such as the angle of the filament within the lamp. The lamp 610A may be connected to a first lamp driver 160A and a first power source 164A. In one implementation, the lamp 610A is connected in series or in parallel with other lamps in the same lamp assembly. The lamp 610B may be included in a second lamp assembly or second subgroup of lamps, where the lamps within the second lamp assembly share a common characteristic such as the angle of the filament within the lamp, wherein the angle of the filament within the lamp 510A is different from the angle of the filament within the lamp 510B. The lamp 410B may be connected to a second lamp driver 160B and a second power source 164B. In one implementation, the lamp 610B is connected in series or in parallel with other lamps in the same lamp assembly.

As depicted in FIG. 6, the filament 206A (shown schematically) of lamp 610A is angled or partially angled relative to the lamp envelope 202A such that a longitudinal axis "L1" that passes through the filament 206A is angled relative to a longitudinal axis "L2" that passes through the lamp envelope 202A, The filament 206B (shown schematically) of lamp 6106 is parallel to the lamp envelope 202B such that the longitudinal axis "L" that passes through the filament 206B is parallel to the longitudinal axis that passes through the lamp envelope 202B.

Figure 7:
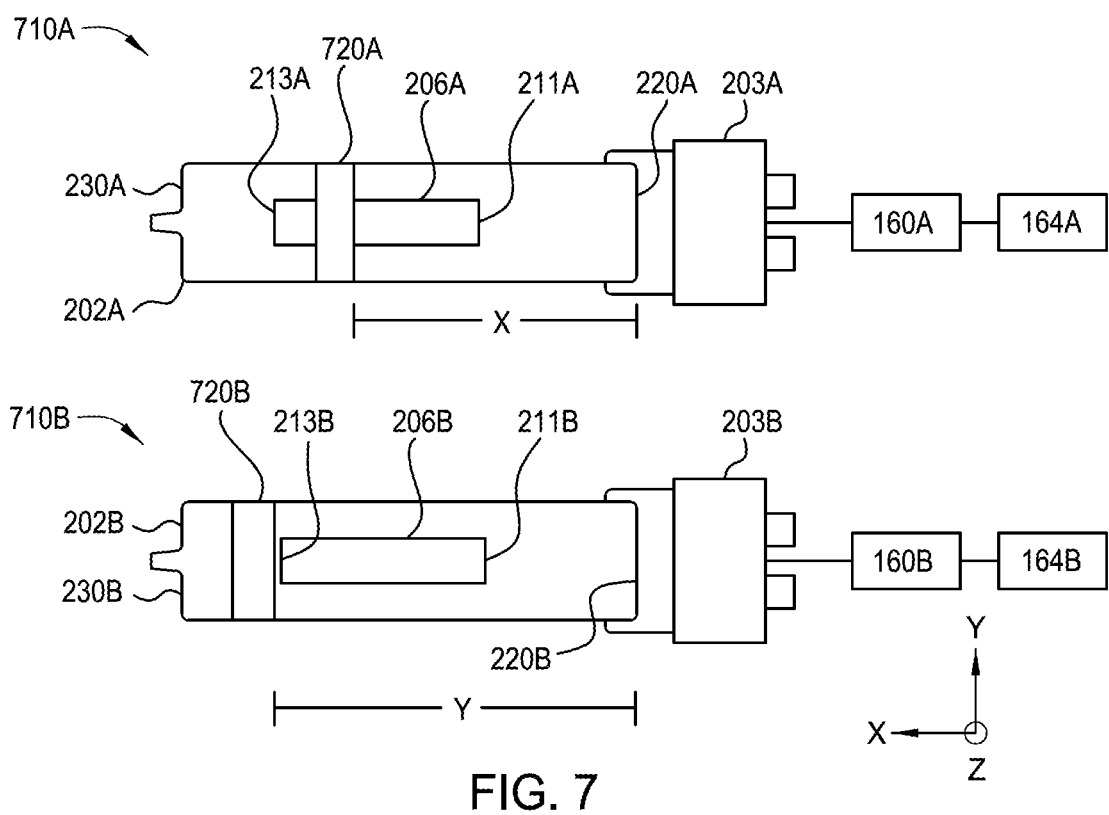
FIG. 7 is a schematic view of another pair of lamps in accordance with one or more implementations of the present disclosure.

FIG. 7 is a schematic view of another pair of lamps 710A, 710B in accordance with one or more implementations of the present disclosure. The lamps 710A, 710B may be similar to lamp 200 depicted in FIG. 2. The filament design and position in lamps 710A, 710B may be used in linear lamps, for example linear lamp(s) 1115 described in FIG. 11A and FIG. 11B. In one implementation, the lamps 710A, 710B are infrared (IR) lamps. Each of the pair of lamps 710A, 710B may be used with any of the implementations described herein. The lamp 710A may be included in a first set or first subgroup of lamps, where the lamps within the first lamp assembly share a common characteristic such as a heat shield 720A covering a portion of the lamp envelope 202A the angle of the filament within the lamp. The heat shield 720A provides a screen to block some of the radiation emitted from the filament 206A. The heat shield is positioned a first distance "x" from the first end 220A of the lamp envelope 202A. The lamp 710A may be connected to a first lamp driver 160A and a first power source 164A. In one implementation, the lamp 710A is connected in series or in parallel with other lamps in the same lamp assembly. The lamp 710B may be included in a second lamp assembly, where the lamps within the second set of or second subgroup of lamps share a common characteristic such as a heat shield 720B covering a portion of the lamp envelope 202B. The heat shield 720B provides a screen to block some of the radiation emitted from the filament 206B. The heat shield is positioned a second distance "y" from the first end 220B of the lamp envelope 202B. The positioning of the heat shield 720A is different from the positioning of the heat shield 720B. In one implementation, the second distance "y" is greater than the first distance "x." The lamp 710B may be connected to a second lamp driver 160B and a second power source 164B. In one implementation, the lamp 710B is connected in series or in parallel with other lamps in the same lamp assembly.

In one implementation, the heat shield 720A, 720B (collectively 720) is an absorptive coating disposed on the lamp envelope 202. The absorptive coating can be any coating, which is capable of absorbing radiation or blocking radiation. In one implementation, the absorptive coating is a carbon black paint or a composition including graphite. Examples of carbon black paint can include AEROGLAZE® Z306 polyurethane coating available from Lord Corporation located in Cary, N.C. Additional examples include the 840 family of HiE-Coat™ high temperature coatings, including 840-C, 840-CM, 840-M coatings, available from Aremco Products, Inc. located in Valley Cottage, N.Y. The absorptive coating can be deposited by various techniques including painting, silk-screening, anodization, chemical vapor deposition (CVD), physical vapor deposition (PVD) or other deposition techniques. The absorptive coating can selectively absorb wavelengths or can be absorbent to a wide variety of wavelengths. The absorptive coating can be composed of one or more layers. In one implementation, the absorptive coating comprises between 1 and 6 layers of carbon black paint.

In another implementation, the heat shield 720A, 720B (collectively 720) is a black opaque coating. In one implementation, the black opaque coating is a black mixture of silicon and silicon dioxide. In the implementation depicted in FIG. 7, the heat shield 720 is a band that encircles the lamp envelope 202.

Figure 8:
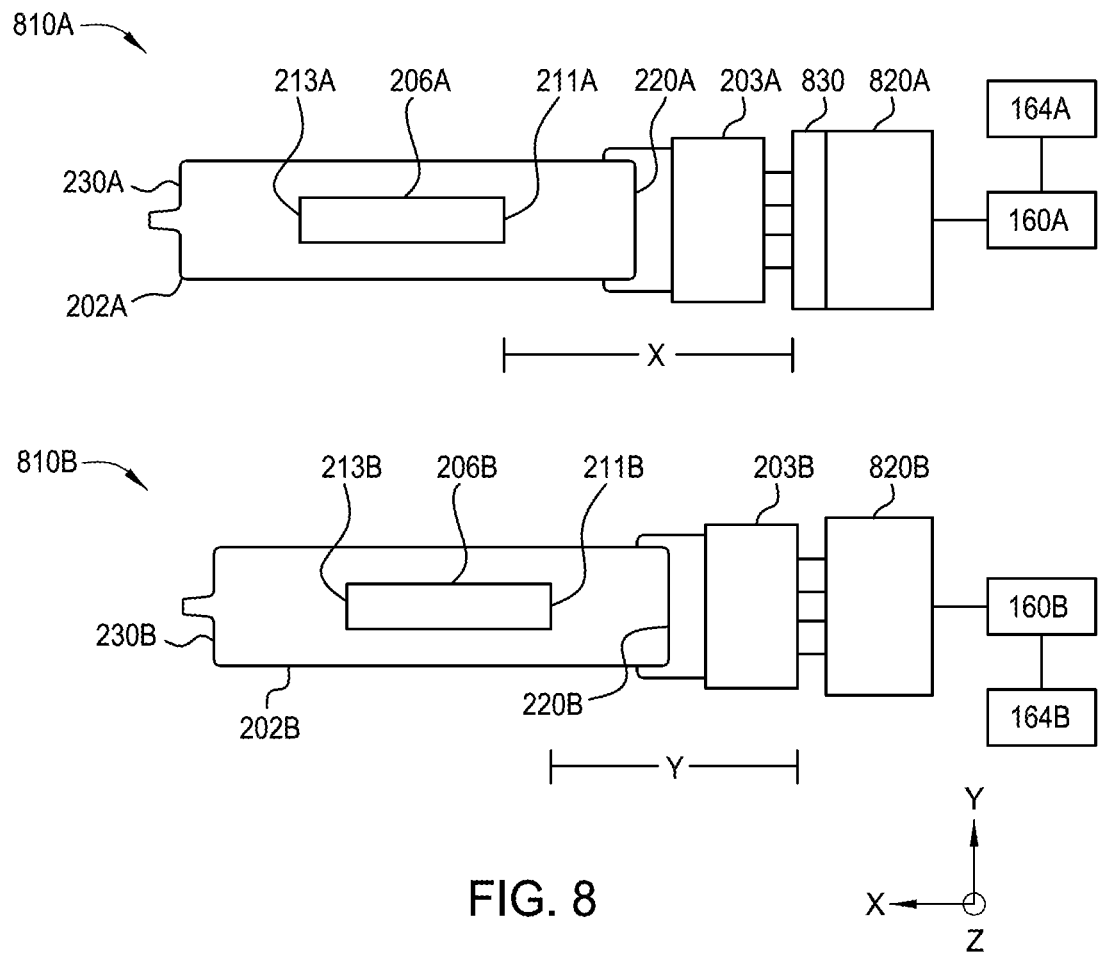
FIG. 8 is a schematic view of another pair of lamps in accordance with one or more implementations of the present disclosure.

FIG. 8 is a schematic view of another pair of lamps 810A, 810B in accordance with one or more implementations of the present disclosure. The lamps 810A, 810B may be similar to lamp 200 depicted in FIG. 2. The filament design and position in lamps 810A, 810B may be used in linear lamps, for example linear lamp(s) 1115 described in FIG. 11A and FIG. 11B. In one implementation, the lamps 810A, 810B are infrared (IR) lamps. Each of the pair of lamps 810A, 810B may be used with any of the implementations described herein. The lamp 810A may be included in a first set or first subgroup of lamps, where the lamps within the first lamp assembly share a common characteristic such as positioning of the filament relative to a lamp socket. The lamp 810A may be connected to a first lamp driver 160A and a first power source 164A. In one implementation, the lamp 810A is connected in series or in parallel with other lamps in the same lamp assembly. The lamp 810B may be included in a second set or second subgroup of lamps, where the lamps within the second lamp assembly share a common characteristic such positioning of the filament relative to a lamp socket, wherein the positioning of the filament 206A (shown schematically) of lamp 810A relative to a respective socket 820A is different from the positioning of the filament 206B (shown schematically) within lamp 810B relative to a respective socket 820B. The lamp 810B may be connected to a second lamp driver 160B and a second power source 164B. In one implementation, the lamp 810B is connected in series or in parallel with other lamps in the same lamp assembly.

In some implementations, the positioning of the filament may be adjusted by modifying the socket 820A, 820B in which the lamps 810A, 810B is positioned. For example, some sockets may be deeper than other sockets, which allows for deeper insertion of the lamp into the lamp's respective socket. In some implementations, the socket may be modified with a spacer or collar to allow for shallower positioning of the lamp. For example, as depicted in FIG. 8, the socket 820A includes a collar 830, which allows for shallower positioning of lamp 810A within the socket 820A.

The lamp 810A includes a lamp envelope 202A, having a first end 220A coupled with base 203A and a second end 230A distal therefrom. The lamp 810A further includes a filament 206A (shown schematically) having a first end 211A and a second end 213A distal therefrom. The lamp 810B includes a lamp envelope 202B, having a first end 220B coupled with base 203B and a second end 230B distal therefrom. The lamp 810B further includes a filament 206B (shown schematically) having a first end 211B and a second end 213B. As depicted in FIG. 8, the first end 211A of the filament 206A is positioned a first distance "x" from the socket 820A and the first end 211B of the filament 206B is positioned a second distance "y" from the socket 820B, wherein the first distance "x" is less than the second distance "y." Thus, the filaments 206A, 206B are located at different positions relative to their respective sockets 820A, 820B.

Figure 9:
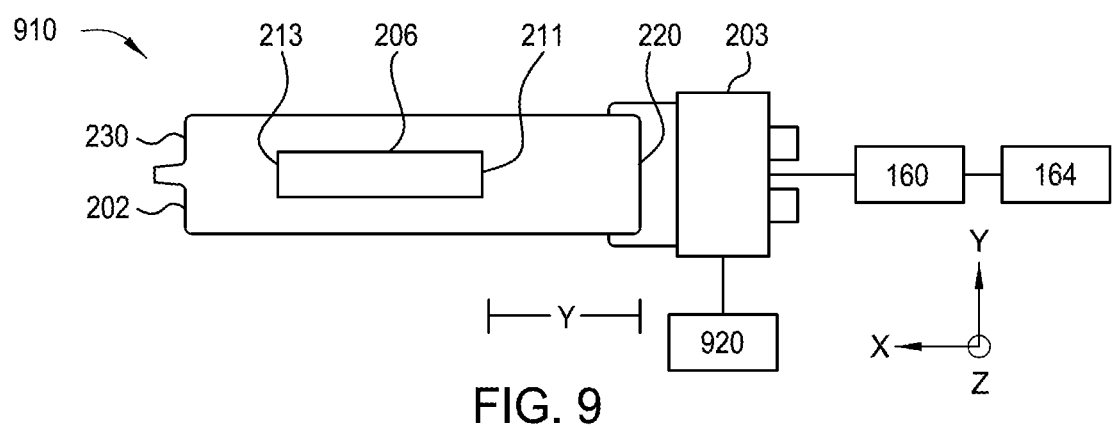
FIG. 9 is a schematic view of an adjustable lamp in accordance with one or more implementations of the present disclosure.

FIG. 9 is a schematic view of an adjustable lamp 910 in accordance with one or more implementations of the present disclosure. The adjustable lamp 910 is coupled with an adjustable stage 920. In some implementations, the adjustable stage 920 may be a 3-axis adjustable stage, which is adjustable in the x-axis, y-axis, and z-axis (perpendicular to the page). In some implementations, the adjustable stage 920 includes a tilt mechanism for tilting the adjustable lamp 910.

The adjustable lamp 910 may be similar to lamp 200 depicted in FIG. 2. The adjustable lamp 910 may be used with any of the implementations described herein. The adjustable lamp 910 may be included in a first set or first subgroup of lamps, where the lamps within the first lamp assembly share a common characteristic such as positioning of the filament relative to a portion of the process chamber (e.g., the reflectors) using the adjustable stage 920. The adjustable lamp 910 may be connected to a lamp driver 160 and a power source 164.

Figure 10:
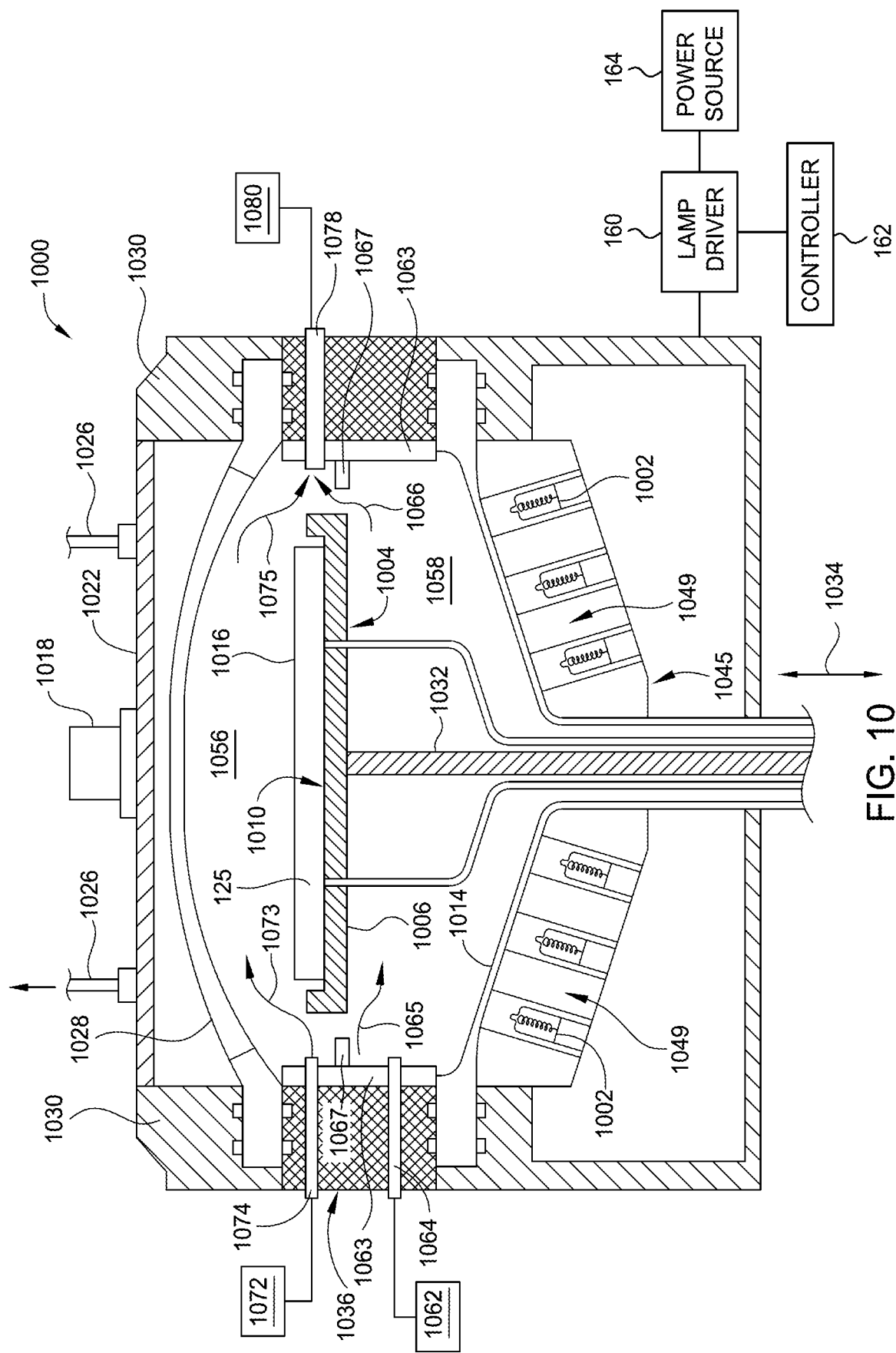
FIG. 10 is a schematic cross-sectional view of another implementation of a thermal processing chamber including an annular lamp array.

FIG. 10 illustrates a schematic sectional view of a process chamber 1000 configured for backside heating and low-pressure epitaxial deposition according to one implementation. The process chamber includes a lamp array that may benefit from the implementations disclosed herein. The process chamber 1000 is used to process one or more substrates therein, including the deposition of a material on an upper surface of a substrate 125. The process chamber 1000 includes an array of lamps 1002 for heating, among other components, a backside 1004 of a substrate support 1006 disposed within the process chamber 1000. The substrate support 1006 may be a disk-like substrate support as shown, or may be a ring-like substrate support (having a central opening), which supports the substrate from the edge of the substrate to facilitate exposure of the substrate to the thermal radiation of the lamps 1002.

The substrate support 1006 is located within the process chamber 1000 between an upper dome 1028 and a lower dome 1014. The upper dome 1028, the lower dome 1014 and a base ring 1036 that is disposed between the upper dome 1028 and lower dome 1014 generally define an internal region of the process chamber 1000. The substrate 125 (not to scale) is transferred into the process chamber 1000 and positioned onto the substrate support 1006 through a loading port (not shown in this view).

The substrate support 1006 is supported by a central shaft 1032, which moves the substrate 125 in a vertical direction 1034 during loading and unloading, and in some instances, during processing of the substrate 125. The substrate support 1006 is shown in an elevated processing position in FIG. 10, but may be vertically traversed using an actuator (not shown) coupled with the central shaft 1032 to a loading position below the processing position. When lowered below the processing position, lift pins (not shown) extend above the surface of the substrate support 1006 to contact the substrate 125 and support the substrate 125 over the substrate support 1006. A robot (not shown) then enters the process chamber 1000 to engage and remove the substrate 125 therefrom though the loading port, and place a new substrate onto the tops of the pins. The substrate support 1006 is then actuated vertically to the processing position to place the substrate 125, with its device side 1016 facing up, on a front side 1010 of the substrate support 1006.

The substrate support 1006, while located in the processing position, divides the internal volume of the process chamber 1000 into a process gas region 1056 that is above the substrate 125, and a purge gas region 1058 below the substrate support 1006. The substrate support 1006 is rotated during processing by the central shaft 1032 to minimize the effect of thermal and process gas flow spatial anomalies within the process chamber 1000 and thus facilitate uniform processing of the substrate 125. The substrate support 1006 may be formed from silicon carbide or graphite coated with silicon carbide to absorb radiant energy from the lamps 1002 and conduct the radiant energy to the substrate 125.

In general, the central window portion of the upper dome 1028 and the bottom of the lower dome 1014 are formed from an optically transparent material such as quartz. The thickness and the degree of curvature of the upper dome 1028 may be configured to provide a flatter geometry for uniform flow uniformity in the process chamber.

The array of lamps 1002 is disposed adjacent to and beneath the lower dome 1014 in a specified, optimal manner around the central shaft 1032 to independently control the temperature at various regions of the substrate 125 as the process gas passes thereover, which facilitates the deposition of a material onto the upper surface of the substrate 125. While not discussed here in detail, the deposited material may include gallium arsenide, gallium nitride, or aluminum gallium nitride. In some implementations, an array of radiant lamps, such as the lamps 1002, may be disposed over the upper dome 1028.

The lamps 1002 may be configured to include bulbs configured to heat the substrate 125 to a temperature within a range of about 200 degrees C. to about 1600 degrees C. Each lamp 1002 is coupled with a power distribution board (not shown) through which power is supplied to each lamp 1002. The lamps 1002 are positioned within a lamphead 1045, which may be cooled during or after processing by, for example, a cooling fluid introduced into channels 1049 located between the lamps 1002. The lamphead 1045 conductively and radiatively cools the lower dome 1014 due in part to the close proximity of the lamphead 1045 to the lower dome 1014. The lamphead 1045 may also cool the lamp walls and walls of reflectors (not shown) around the lamps. Alternatively, the lower dome 1014 may be cooled by a convective approach. Depending upon the application, the lampheads 1045 may or may not be in contact with the lower dome 1014.

A circular shield 1067 may be optionally disposed around the substrate support 1006 and surrounded by a liner assembly 1063. The circular shield 1067 prevents or minimizes leakage of heat/light noise from the lamps 1002 to the device side 1016 of the substrate 125 while providing a pre-heat zone for the process gases. The circular shield 1067 may be made from CVD SiC, sintered graphite coated with SiC, grown SiC, opaque quartz, coated quartz, or any similar, suitable material that is resistant to chemical breakdown by process and purge gases.

A liner assembly 1063 is sized to be nested within, or surrounded by, an inner circumference of the base ring 1036. The liner assembly 1063 shields the processing volume (e.g., the process gas region 1056 and purge gas region 1058) from metallic walls of the base ring 1036 of the process chamber 1000. The metallic walls may react with precursors and cause contamination in the processing volume. While the liner assembly 1063 is shown as a single body, the liner assembly 1063 may include one or more liners with different configurations.

As a result of backside heating of the substrate 125 by the substrate support 1006, the use of an optical pyrometer 1018 for temperature measurements/control on the substrate support can be performed. This temperature measurement by the optical pyrometer 1018 may also be done on the device side 1016 of the substrate 125, having an unknown emissivity, since heating the substrate front side 1010 in this manner is emissivity independent. As a result, the optical pyrometer 1018 can only sense radiation from the heated substrate 125 that receives heat conducted from the substrate support 1006, with minimal background radiation from the lamps 1002 directly reaching the optical pyrometer 1018.

A reflector 1022 may be optionally placed outside the upper dome 1028 to reflect light that is radiating off the substrate 125 back onto the substrate 125. The reflector 1022 may be secured to the upper dome 1028 using a clamp ring 1030. The reflector 1022 can be made of a metal such as aluminum or stainless steel. The efficiency of the reflection can be improved by coating a reflector area with a highly reflective coating such as gold. The reflector 1022 can have one or more channels 1026 connected to a cooling source (not shown). The channels 1026 connect to a passage (not shown) formed on a side of the reflector 1022 for cooling the reflector 1022. The passage is configured to carry a flow of a fluid such as temperature controlled water and may run horizontally along the side of the reflector 1022 in any targeted pattern covering a portion or entire surface of the reflector 1022.

Process gas supplied from a process gas supply source 1072 is introduced into the process gas region 1056 through a process gas inlet 1074 formed in the sidewall of the base ring 1036. The process gas inlet 1074 is configured to direct the process gas in a generally radially inward direction. During the film formation process, the substrate support 1006 is located in the processing position, which is adjacent to and at about the same elevation as the process gas inlet 1074, allowing the process gas to flow along flow path 1073 across the upper surface of the substrate 125 in a laminar flow. The process gas exits the process gas region 1056 (along flow path 1075) through a gas outlet 1078 located on the side of the process chamber 1000 opposite the process gas inlet 1074. Removal of the process gas through the gas outlet 1078 may be facilitated by a vacuum pump 1080 coupled thereto. Process gas inlet 1074 and gas outlet 1078 are each configured as slot like openings extending generally at least the diameter of the substrate support 1006 to allow process gasses to be disbursed over the entire width of the substrate. As the process gas inlet 1074 and the gas outlet 1078 are aligned with, and opposed to, each other and disposed approximately at the same elevation, it is believed that such a parallel arrangement thereof, when combined with an upper dome 1028 enables a generally planar, uniform gas flow across the substrate 125. Further radial uniformity may be provided by the rotation of the substrate 125 by rotating the substrate support 1006.

A purge gas is supplied from a purge gas source 1062 to the purge gas region 1058 below the substrate support 1006 through a purge gas inlet 1064 (or through the process gas inlet 1074) formed in the sidewall of the base ring 1036 below the process gas inlet 1074. If the circular shield 1067 or a pre-heat ring (not shown) is used, the circular shield or the pre-heat ring may be disposed between the process gas inlet 1074 and the purge gas inlet 1064. In either case, the purge gas inlet 1064 is configured to direct the purge gas in a generally radially inward direction with respect to the substrate support 1006. During the film formation process, the substrate support 1006 is located at a position such that the purge gas flows along flow path 1065 across the backside 1004 of the substrate support 1006 in a laminar flow. Without being bound by any particular theory, the flowing of the purge gas is believed to prevent or substantially avoid the flow of the process gas from entering into the purge gas region 1058, or to reduce diffusion of the process gas entering the purge gas region 1058 (e.g., the region under the substrate support 1006). The purge gas exits the purge gas region 1058 (along flow path 1066) and is exhausted out of the process chamber through the gas outlet 1078, which is located on the side of the process chamber 1000 opposite the purge gas inlet 1064.

Figure 11A:
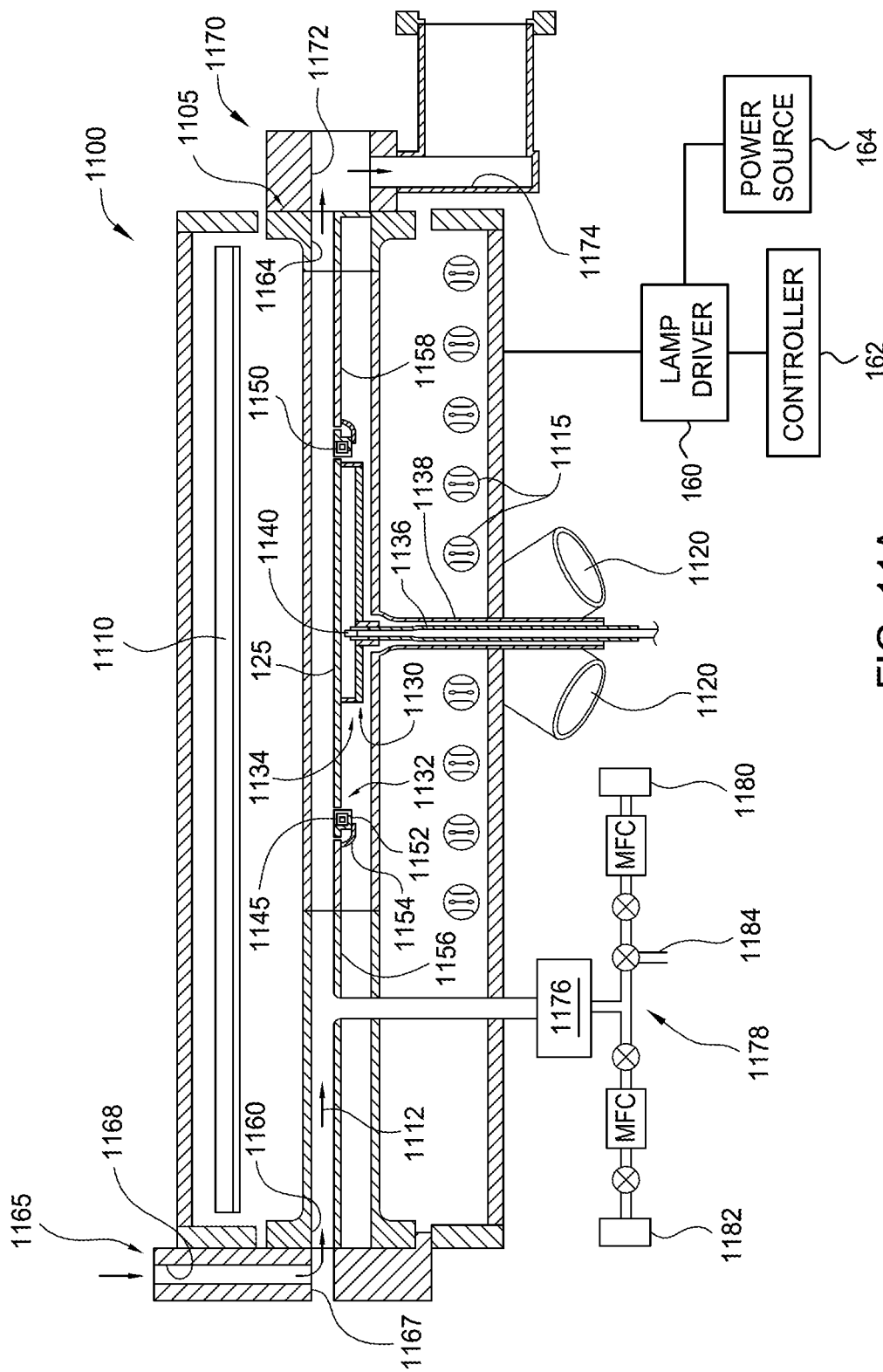
FIG. 11A is a schematic cross-sectional view of yet another implementation of a thermal processing chamber including a linear lamp array.

FIG. 11A illustrates single substrate deposition reactor 1100, including a quartz process or reaction chamber 1105, according to one implementation. In some implementations, the chamber 1105 is a single-substrate processing chamber. The deposition reactor 1100 includes a linear lamp array that may benefit from the implementations disclosed herein. The deposition reactor 1100 may be utilized for CVD of a number of different materials, including SiGe and Ge films as disclosed herein. Moreover, the illustrated deposition reactor 1100 can benefit from the lamp designs and lamp positioning described herein.

The deposition reactor 1100 may generally have the shape of a rectangular box. A plurality of radiant heat sources is supported outside the chamber 1105 to provide heat energy into the chamber 1105 without appreciable absorption thereof by the walls of the chamber 1105. While the implementations are described in the context of a "cold wall" CVD reactor for processing semiconductor substrates, it will be understood that the methods described herein will have utility in conjunction with other heating/cooling systems, such as those employing inductive or resistive heating.

The radiant heat sources comprise an upper heating assembly of linear lamp(s) 1110. In one implementation, the linear lamp(s) 1110 are elongated tube-type radiant heating elements. The upper heating assembly of linear lamp(s) 1110 are preferably disposed in spaced-apart parallel relationship and substantially parallel to a reactant gas flow path (shown by arrow 1112) through the chamber 1105. A lower heating assembly comprises similar linear lamp(s) 1115 positioned below the chamber 1105, and oriented transverse to the upper heating assembly of linear lamp(s) 1110. A portion of the radiant heat is diffusely reflected into the chamber 1105 by rough specular reflector plates (not shown) above and below the upper and lower linear lamp(s) 1110, 1115, respectively. Additionally, a plurality of spot lamps 1120 supply concentrated heat to the underside of the substrate support structure (described below), to counteract a heat sink effect created by portions of support structures extending through the bottom of the chamber 1105 conducting heat away from the substrate support, and thus cooling it. In some implementations, each of the linear lamp(s) 1110, 1115 is a high-intensity tungsten filament lamp producing radiant heat energy transmitted through the walls of the chamber 1105 without appreciable absorption. As is known in the art of semiconductor processing equipment, the power of the various linear lamp(s) 1110, 1115 and spot lamps 1120 can be controlled independently or in grouped zones in response to changes of the substrate temperature detected by temperature sensors.

A workpiece, comprising a substrate 125, is shown supported within the chamber 1105 upon a substrate support structure 1130. In one implementation, the substrate 125 is a silicon substrate. The illustrated substrate support structure 1130 includes a substrate holder 1132, upon which the substrate 125 rests, and a support spider 1134. The support spider 1134 is mounted to a shaft 1136, which extends downwardly through a tube 1138 extending through the chamber lower wall. The tube 1138 communicates with a source of purge gas, which can flow therethrough during processing of a substrate. The purge gas inhibits process gases from entering the lower section of the chamber 1105. The purge gas may also flow horizontally beneath the substrate 125.

A plurality of temperature sensors is positioned in proximity to the substrate 125. The temperature sensors may take a variety of forms, such as optical pyrometers or thermocouples. In the illustrated implementation, the temperature sensors comprise thermocouples, including a first or central thermocouple 1140, suspended below the substrate holder 1132 in any suitable fashion. The central thermocouple 1140 passes through the support spider 1134 in proximity to the substrate holder 1132. The deposition reactor 1100 further includes a plurality of secondary or peripheral thermocouples, also in proximity to the substrate 125, including a leading edge or front thermocouple 1145, a trailing edge or rear thermocouple 1150, and a side thermocouple (not shown). Each of the peripheral thermocouples is housed within a slip ring 1152, which surrounds the substrate holder 1132 and the substrate 125. Each of the central and peripheral thermocouples are connected to a temperature controller, which sets the power supplied to the various linear lamp(s) 1110, 1115, and spot lamps 1120 in response to the readings of the thermocouples.

In addition to housing the peripheral thermocouples, the slip ring 1152 absorbs and emits radiant heat during high temperature processing. The slip ring 1152 thus compensates for a greater heat loss or absorption at the substrate edges, a phenomenon. By minimizing edge losses, slip ring 1152 can reduce the risk of radial temperature non-uniformities across the substrate 125. The slip ring 1152 can be suspended by any suitable means. For example, the illustrated slip ring 1152 rests upon support members 1154, which extend from a front chamber divider 1156, and a rear chamber divider 1158. The dividers 1156, 1158 desirably are formed of quartz. In some arrangements, the rear chamber divider 1158 can be omitted.

The illustrated chamber 1105 includes an inlet port 1160 for the injection of reactant and carrier gases, and the substrate 125 can be received therethrough. An outlet port 1164 is on the opposite side of the chamber 1105, with the substrate support structure 1130 positioned between the inlet port 1160 and outlet port 1164.

An inlet component 1165 is fitted to the chamber 1105, adapted to surround the inlet port 1160, and includes a horizontally elongated slot 1167 through which the substrate 125 can be inserted. A generally vertical inlet 1168 receives gases from gas sources and communicates such gases with the slot 1167 and the inlet port 1160. While not separately illustrated in FIG. 11A, the gas sources may include hydrogen, silicon and germanium precursors, and a controller (e.g., preprogrammed computer) that controls a sequence of steps as described herein, including flowing the surface active compound into the chamber during a cool down step prior to Si and/or Ge deposition. The vertical inlet 1168 can include gas injectors designed to maximize uniformity of gas flow for the single-substrate reactor.

An outlet component 1170 similarly mounts to the chamber 1105 such that an exhaust opening 1172 aligns with the outlet port 1164 and leads to exhaust conduits 1174. The exhaust conduits 1174, in turn, can communicate with suitable vacuum means (not shown) for exhausting process gases from the chamber 1105. In one implementation, process gases are drawn through the chamber 1105 and then downstream to a scrubber (not shown). A vacuum pump is preferably included to aid in drawing process gases through the chamber 1105, and to evacuate the chamber for reduced pressure processing, e.g., below atmospheric pressure but above ultra-high vacuum pressure ranges, as discussed below.

The illustrated deposition reactor 1100 also includes a source 1176 of excited species, positioned upstream from the deposition reactor 1100. The source 1176 of excited species of the illustrated implementation comprises a remote plasma generator, along a gas line 1178. In the illustrated implementation, microwave energy from the RPS energy source is coupled with a flowing gas in an applicator along the gas line 1178. A precursor gas source 1180 is coupled with the gas line 1178 for introduction into the source 1176 of excited species. A carrier gas source 1182 is also coupled with the gas line 1178. One or more branch lines 1184 can also be provided for additional reactants. As is known in the art, the gas sources 1180, 1182 can comprise gas tanks, bubblers, etc., depending upon the form and volatility of the reactant species. Each gas line can be provided with a separate mass flow controller (MFC) and valves, as shown, to allow selection of relative amounts of carrier and reactant species introduced to the source 1176 of excited species and thence into the chamber 1105. The source 1176 of excited species can be employed for plasma-enhanced deposition, but also may be utilized for exciting etchants for cleaning the chamber 1105 of excess deposition when no substrate is in the chamber 1105.

The total volume capacity of the chamber 1105 designed for processing 200 mm substrates, for example, is less than about 30 liters, such as less than about 20 liters, and in one implementation is less than about 10 liters. The illustrated chamber 1105 has a capacity of about 7.5 liters. Because the illustrated chamber 1105 is partitioned by the dividers 1156, 1158, substrate holder 1132, the slip ring 1152, and the purge gas flowing from the tube 1138, the effective volume through which process gases flow is around half the total volume (e.g., about 3.77 liters in the illustrated implementation). It is understood that the volume of the chamber 1105 can be different, depending upon the size of the substrates for which the chamber 1105 is designed to accommodate. For example, if the chamber 1105 is a single-substrate processing chamber for 300 mm substrates, the chamber typically has a capacity of less than about 100 liters, such as about 60 liters, and in one implementation is less than about 30 liters. In one example, the chamber 1105 for processing a 300 mm substrate has a total volume of about 24 liters, with an effective volume of about 12 liters.

Deposition temperatures for a Ge-containing layer are typically in the range of about 250 degrees Celsius (C) to about 600 degrees C., for example about 300 degrees C. to about 450 degrees C. For example, lower deposition temperatures tend to be more appropriate as the thermal stability of the precursor decreases. The total pressure in the chamber 1105 is in the range of about 10-5 Torr to about 800 Torr. In some implementations, the pressure is about 200 mTorr to about 760 Torr, such as about 1 Torr to about 200 Torr, for example about 1 Torr to about 60 Torr.

Figure 11B:
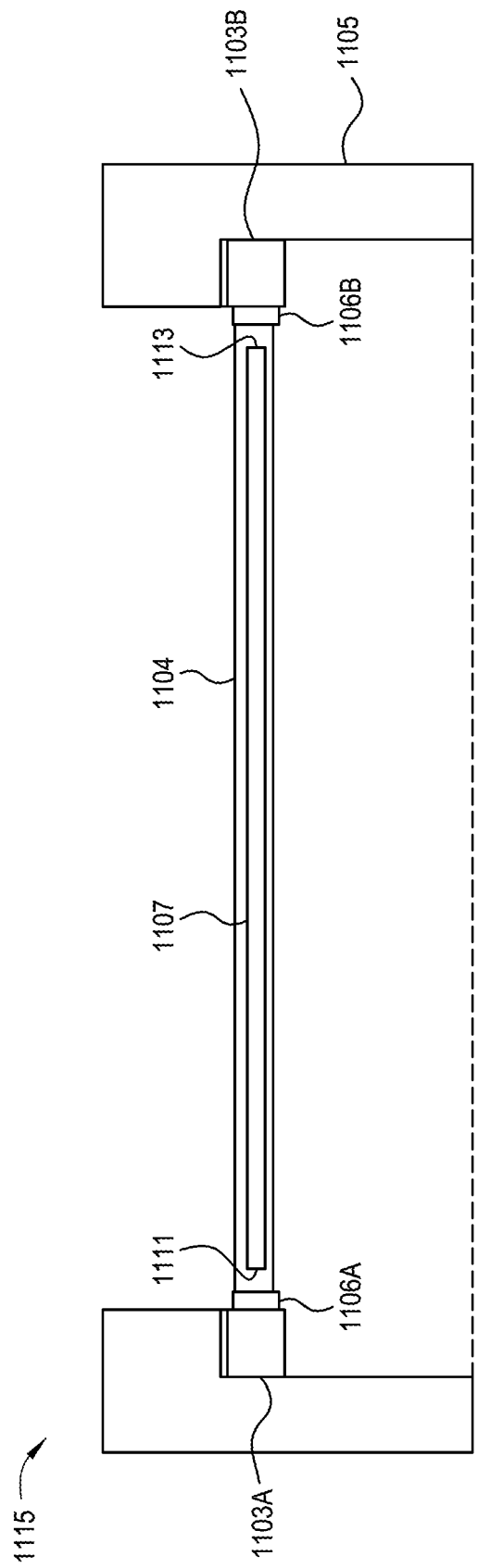
FIG. 11B is a schematic cross-sectional view of a linear lamp used in the linear lamp array of FIG. 11A.

FIG. 11B is a schematic cross-sectional view of the linear lamp(s) 1115 used in the linear lamp array of FIG. 11 A. The linear lamp(s) 1115 may benefit from any of the lamp design and lamp positioning implementations described herein. The linear lamp(s) 1115 may be used in place of linear lamp(s) 1110. The linear lamp(s) 1115 includes a lamp envelope 1104, having a first end 1106A coupled with a first base 1103A and a second end 1106B distal therefrom and coupled with a second base 1103B. The linear lamp(s) 1115 further includes a filament 1107 having a first end 1111 and a second end 1113 distal therefrom. In some implementations, the filament 1107 extends along a longitudinal axis of the lamp envelope 1104 extending from the first end 1106A to the second end 1106B. The first base 1103A and the second base 1103B of each linear lamp(s) 1115 are each connected to the chamber 1105 at opposing locations. Electrical connections can be provided to each linear lamp(s) 1115 at the first end 1106A and the second end 1106B.

Figure 12:
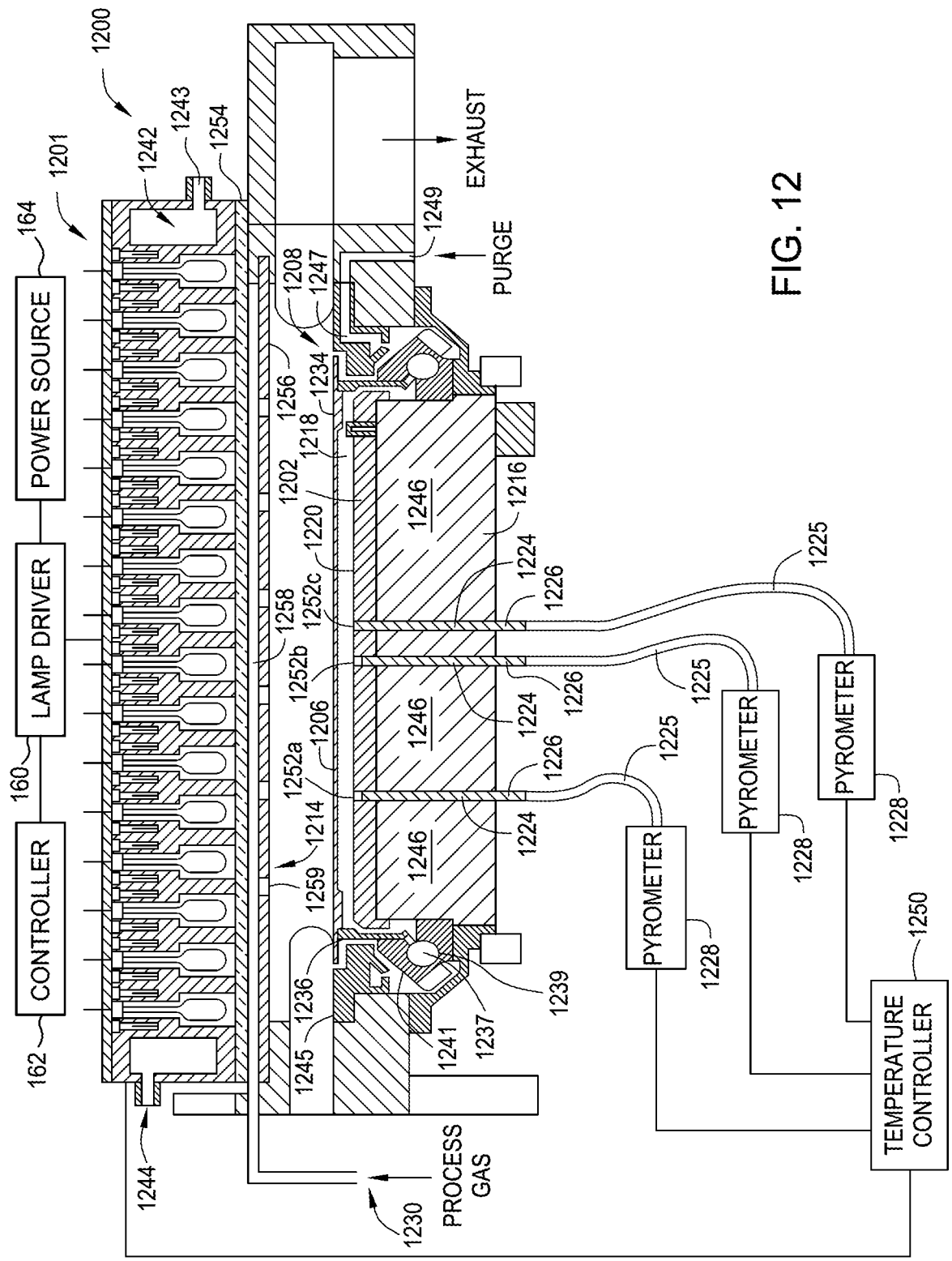
FIG. 12 is a schematic cross-sectional view of yet another implementation of a thermal processing chamber including a linear lamp array.

FIG. 12 depicts a Rapid Thermal Processing system (RTP) in accordance with some implementations of the present disclosure. Exemplary RTP chambers may include the RADIANCE® or RADIANCEPlus chambers available from Applied Materials, Inc. of Santa Clara, Calif. The RTP system may include a processing chamber 1200 having a lamphead 1201 for processing a substrate 1206. The lamphead 1201 may include an array of lamps as depicted in FIG. 12. The array of lamps may benefit from the implementations disclosed herein.

The substrate 1206 is mounted inside the processing chamber 1200 on a substrate support 1208 and is heated by the lamphead 1201, which is disposed in a position opposing the substrate support 1208. The lamphead 1201 generates radiation, which is directed to a front side 1207 of the substrate 1206. Alternatively (not shown), the lamphead 1201 may be configured to heat the backside of the substrate 1206, for example, such as by being disposed below the substrate 1206, or by directing the radiation to the backside of the substrate 1206. The radiation enters the processing chamber 1200 through a window assembly 1214. The window assembly 1214 may be a water-cooled quartz window assembly. A reflector 1202, which is mounted on a water-cooled base 1216, is positioned beneath the substrate 1206. The water-cooled base 1216 may be a stainless steel base. The water-cooled base 1216 includes a circulation circuit 1246 through which coolant circulate to cool the reflector 1202. In some implementations, the reflector 1202 is made of aluminum and has a highly reflective surface coating 1220. Water, which may be above 23 degrees Celsius, is circulated through the water-cooled base 1216 to keep the temperature of the reflector 1202 well below that of the heated substrate 1206. Alternatively, other coolants may be provided at the same or different temperatures. For example, antifreeze (e.g., ethylene glycol, propylene glycol, or the like) or other heat transfer fluids may be circulated through the water-cooled base 1216 and/or the water-cooled base 1216 may be coupled with a chiller (not shown). An underside or backside of the substrate 1206 and the top of the reflector 1202 form a reflecting cavity 1218. The reflecting cavity 1218 enhances the effective emissivity of the substrate 1206.

The temperatures at localized regions of the substrate 1206 are measured by a plurality of temperature sensors, such as sensors 1252a, 1252b, and 1252c. Each temperature sensor includes a light pipe 1226 that passes through a conduit 1224 that extends from the backside of the water-cooled base 1216 through the top of the reflector 1202. The light pipe 1226 may be a sapphire light pipe. In some implementations, the light pipe 1226 is about 0.125 inch in diameter and the conduit 1224 is slightly larger. The light pipe 1226 is positioned within the conduit 1224 so that its uppermost end is flush with or slightly below the upper surface of the reflector 1202. The other end of light pipe 1226 couples to a flexible optical fiber 1225 that transmits sampled light from the reflecting cavity 1218 to a pyrometer 1228.

The pyrometer 1228 is connected to a controller 1250, which controls the power supplied to the lamphead 1201 in response to a measured substrate temperature. In some implementations, such as for a 200 mm wafer, the lamphead 1201 may use 187 lamps to deliver highly collimated radiation from tungsten-halogen lamps to the processing chamber 1200. In some implementations, such as for a 300 mm wafer, the lamphead 1201 may use 409 lights. The number and configuration of the lights disclosed herein are exemplary and other numbers and configurations may be used.

The lamps may be grouped in multiple zones. The zones can be individually adjusted by the controller 1250 to allow controlled radiative heating of different areas of the substrate 1206.

As indicated above, the described implementations use measurement or temperature sensors distributed over the reflector 1202 to measure the temperature of the substrate 1206 at different radii thereof. During the thermal processing, the substrate 1206 is rotated, for example, at about 240 rpm. Thus, each sensor actually samples the temperature profile of a corresponding annular ring area on the substrate 1206, and one measures the temperature at the center of the substrate 1206.

The substrate support 1208 may be configured to be stationary or may rotate the substrate 1206. The substrate support 1208 is configured as a support ring 1234, which contacts the substrate 1206 around the substrate's outer perimeter, thus leaving the entire underside of the substrate 1206, exposed except for a small annular region about the outer perimeter. The support ring 1234 is also known as an edge ring and these two terms can be interchangeably used within the specification. In some implementations, the support ring 1234 has a radial width of approximately one inch (2.5 centimeters (cm)) from the inner to out edges thereof. To minimize the thermal discontinuities that will occur at the edge of the substrate 1206 during processing, the support ring 1234 is made of the same, or similar, material as that of the substrate 1206, for example, silicon or silicon carbide.

The support ring 1234 rests on a rotatable tubular quartz cylinder 1236 that is coated with silicon to render it opaque in the frequency detection range of the pyrometer 1228. The silicon coating on the quartz cylinder 1236 acts as a baffle to block out radiation from the external sources that might contaminate the intensity measurements. The bottom of the quartz cylinder 1236 is held by an annular upper bearing 1241 which rests on a plurality of ball bearings 1237 that are, in turn, held within a stationary, annular, lower bearing race 1239. In some implementations, the ball bearings 1237 are made of steel and coated with silicon nitride to reduce particulate formation during operations. The annular upper bearing 1241 is magnetically coupled with an actuator (not shown) which rotates the quartz cylinder 1236, the support ring 1234 and the substrate 1206 during the thermal processing.

A purge ring 1245, which is fitted into the chamber body, surrounds the quartz cylinder 1236. In some implementations, the purge ring 1245 has an internal annular cavity 1247, which opens up to a region above the annular upper bearing 141. The internal annular cavity 1247 is connected to a gas supply (not shown) through a passageway 1249. During processing, a purge gas is flowed into the chamber through the purge ring 1245. Gases are exhausted through an exhaust port, which is coupled with a vacuum pump (not shown).

In some implementations, the support ring 1234 has an outer radius that is larger than the radius of the quartz cylinder 1236 so that it extends out beyond the quartz cylinder 1236. The annular extension of the support ring 1234 beyond the quartz cylinder 1236, in cooperation with the purge ring 1245 located below it, functions as a baffle, which prevents stray light from entering the reflecting cavity 1218 at the backside of the substrate 1206. To further reduce the possibility of stray light entering into the reflecting cavity 1218, the support ring 1234 and the purge ring 1245 may also be coated with a material (for example, a black or gray material) that absorbs the radiation generated by the lamphead 1201.

The window assembly 1214 is disposed in an upper portion of the processing chamber 1200 to allow light energy provided by the lamphead 1201 to enter the processing chamber 1200. In some implementations, the window assembly 1214 includes an upper window 1254 and a lower window 1256. The upper window 1254 and the lower window 1256 each comprise a material transparent to the energy provided by the lamphead 1201 to allow radiation from the lamphead 1201 to enter the processing chamber 1200 therethrough. In some implementations, the upper window 1254 and the lower window 1256 are quartz. However, the upper window 1254 and the lower window 1256 may be made out of different materials as well.

Generally, the upper window 1254 and the lower window 1256 are configured to allow the maximum energy provided by the lamphead 1201 to pass therethrough. In some implementations, a thickness of the upper window 1254 and/or the lower window 1256 may be varied to control the quantity of energy passing therethrough. For example, in some implementations the thickness of the upper window may be between about 3 to about 8 mm. In some implementations, the thickness of the lower window may be between about 3 to about 8 mm.

During processing, a processing gas is introduced into the processing chamber 1200 above the substrate 1206 through the window assembly 1214. The window assembly 1214 is used to more uniformly distribute the processing gas to the substrate 1206 from overhead, as compared to processing chambers utilizing side injecting gas systems (e.g., delivering gas into the processing volume of the processing chamber from the sides of the processing chamber).

The lower window 1256 is disposed below the upper window 1254 and is spaced apart therefrom, to define a gap 1258 therebetween. The gap 1258 forms a plenum for receiving and flowing the processing gas therein from the inlet 1230. In some implementations, the gap is between about 1-5 mm. The lower window 1256 includes one or more outlets 1259 for delivering the processing gas from the plenum (e.g., the gap 1258) into the processing volume of the processing chamber 1200. The size, geometry, number, and location of the one or more outlets 1259 can be selectively chosen to facilitate a targeted pattern of processing gas flow.

For example, a cross section of each of the one or more outlets 1259 may be round, rectangular, square, oval, slotted, polygonal, or the like or combinations thereof. Each of the one or more outlets 1259 may have a cross-section configured, for example, control the flow rate and/or direction of a processing gas flowing therefrom. In some implementations, at least some of the one or more outlets 1259 may have a cross section that varies along an axis parallel to the direction of gas flow. For example, in some implementations, at least some of the one or more outlets 1259 may have an expanding cross section to facilitate dispersing the processing gas flowing therethrough. For example, at least some of the one or more outlets 1259 may have a first width proximate an upper surface of the lower window 1256 that is less than a second width proximate a lower, substrate support-facing surface of the lower window 1256. In some implementations, at least some of the one or more outlets 1259 may have a tapering cross section to facilitate providing a higher velocity of the processing gas flowing therethrough. For example, at least some of the one or more outlets 1259 may have a first width proximate the upper surface of the lower window 1256 that is greater than a second width proximate the lower, substrate support-facing surface of the lower window 1256. In some implementations, at least some of the one or more outlets 1259 may have a non-vertical central axis to facilitate directing the flow of the processing gas flowing therethrough at a non-perpendicular angle to the substrate.

The one or more outlets 1259 may be distributed in the lower window 1256 in any suitable configuration to achieve a targeted distribution of a processing gas to the substrate 1206. The targeted distribution may be uniform or non-uniform, depending upon the process being performed in the processing chamber. For example, the one or more outlets 1259 may be distributed as chosen in two dimensions across the surface of the lower window 1256. In some implementations, the one or more outlets 1259 may be uniformly distributed across the entire surface of the lower window 1256. In some implementations, the one or more outlets 1259 may be grouped into one or more targeted zones, such as an outer zone, an intermediate zone, and an inner zone. In such a configuration of the one or more outlets 1259, the substrate support 1208 may be stationary or rotating about a central axis.

In one process application, the lamphead is adapted to heat a buffer layer on the substrate 1206 to a temperature sufficient to cause the buffer layer to relax. The temperature sufficient to cause the buffer layer to relax may be dependent upon factors including but not limited to the buffer layer materials and substrate materials used, the relative strain with respect to the substrate material, and the duration of the process. The lamphead 1201 may be adapted to heat the buffer layer formed on the substrate 1206 to a temperature within a range of about 10 degrees Celsius to about 1800 degrees Celsius, such as about 400 degrees Celsius to about 600 degrees Celsius. The lamphead 1201 may be coupled with a power distribution board (not shown) through which power is supplied to each lamp of the lamphead 1201. The lamphead 1201 may be cooled during or after processing by, for example, a cooling fluid.

A cooling chamber 1242 is defined by upper and lower chamber walls and a cylindrical wall. A coolant such as water is be introduced into the chamber via inlet 1243 and removed via outlet 1244.

The controller 1250 receives data from the temperature sensors 1252a-c and separately adjusts power delivered to each lamp of the lamphead 1201, or individual groups of lamps or lamp zones, based on the data received. The controller 1250 may include a power supply that independently powers the various lamps or lamp zones. The controller 1250 can be configured with a targeted temperature profile, and based on comparing the data received from the temperature sensors 1252a-c, the controller 1250 adjusts power to lamps and/or lamp zones to conform the observed thermal data to the targeted temperature profile. The controller 1250 may also adjust power to the lamps and/or lamp zones to conform the thermal treatment of one substrate to the thermal treatment of another substrate, in the event chamber performance drifts over time.

In summary, some benefits of the present disclosure methods and apparatus for fine tuning temperature control within a thermal processing chamber without significant redesign of current chamber hardware, which increases substrate throughput while reducing the overall cost of ownership. In some implementations of the present disclosure, fine-tuning of temperature control is achieved by segregating different lamps within an array of lamps into various subgroups or lamp assemblies, based on a specific characteristic thereof. The selection criteria for subgroups of lamps may be based on characteristics such as lamp design and/or lamp positioning within the processing chamber. For example, various lamp designs and/or positioning may be used to vary filament position relative to a chamber component such as the reflectors of the chamber. Examples of characteristics based on lamp design include, but are not limited to, the size of the filament within each lamp, the angle of the filament within each lamp, the number of turns of the filament helix within each lamp, the position of the filament within each lamp, and/or the location of one or more heat shields on different section of the lamp envelope, which encloses the filament. Examples of characteristics based on lamp positioning include but are not limited to modifying a lamp socket to affect the position of the lamp, modifying the lamp socket to affect the tilt, e.g., an angle with respect to a ray perpendicular to the substrate support, of each lamp filament, and/or positioning one or more lamps on a movable stage with an optional tilt mechanism. The lamps sharing a selected characteristic can be divided into subgroups or lamp assemblies within an array that form a lamp string (e.g., lamp zones formed by strings of 1-5 lamps in series or parallel). Each lamp string can be controlled with an individual electric driving circuit in order to introduce a targeted infrared radiation profile tuning range at the substrate.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. An apparatus operable to heat a substrate, comprising:
   a first annular lamp array, comprising:
   two or more lamp subgroups operable to provide radiant energy to heat a substrate, comprising:
   a first lamp subgroup, comprising:
   a first plurality of lamps, wherein each lamp of the first plurality of lamps comprises:
   a first envelope having a first end and a second end;
   a base coupled with the first end of the first envelope to support the first envelope; and
   a first filament positioned along a longitudinal axis extending from the first end of the first envelope to the second end of the first envelope, wherein each lamp of the first plurality of lamps has at least one characteristic of the following set of characteristics: the first filament has a first length, an end of the first filament is positioned a first distance from the first end of the first envelope, the first filament has a first number of coils, and the first envelope comprises a first opaque portion positioned a second distance from the first end of the first envelope; and a first lamp driving circuit electrically coupled with and operable to control the first plurality of lamps in the first lamp subgroup; and a second lamp subgroup, comprising:
a second plurality of lamps, wherein each lamp of the second plurality of lamps comprises:
a second envelope having a first end and a second end;
a base coupled with the first end of the second envelope to support the second envelope; and
a second filament positioned along a longitudinal axis extending from the first end of the second envelope to the second end of the second envelope, wherein each lamp of the second plurality of lamps has at least one characteristic of the following set of characteristics: the second filament has a second length, the end of the second filament is positioned a third distance from the first end of the second envelope, the second filament has a second number of coils, and the second envelope comprises a second opaque portion positioned a fourth distance from the first end of the second envelope; and
a second lamp driving circuit electrically coupled with and operable to control the second plurality of lamps in the second lamp subgroup, wherein the first lamp driving circuit is independently controllable relative to the second lamp driving circuit, and
wherein the at least one characteristic of the first lamp subgroup differs from the at least one characteristic of the second lamp subgroup.

2. The apparatus of claim 1, further comprising a second annular lamp array having a third plurality of lamps, wherein the second annular lamp array is concentric with the first annular lamp array.

3. The apparatus of claim 1, wherein the first distance is greater than the third distance.

4. The apparatus of claim 1, wherein the second distance is greater than the fourth distance.

5. The apparatus of claim 1, wherein the first number of coils is greater than the second number of coils.

6. The apparatus of claim 1, wherein the first length is greater than the second length.

7. The apparatus of claim 1, wherein a longitudinal axis that passes through the first filament is angled relative to the longitudinal axis that extends from the first end of the first envelope to the second end of the first envelope and a longitudinal axis that passes through the second filament is parallel to the longitudinal axis that extends from the first end of the second envelope to the second end of the second envelope.

8. The apparatus of claim 1, wherein the first plurality of lamps are wired in series and the second plurality of lamps are wired in series.

9. The apparatus of claim 1, wherein the first plurality of lamps are wired in parallel and the second plurality of lamps are wired in parallel.

10. The apparatus of claim 1, wherein the first envelope comprises the first opaque portion and the first opaque portion is an annular band disposed on the first envelope.

11. The apparatus of claim 10, wherein the second envelope comprises the second opaque portion and the second opaque portion is an annular band disposed on the second envelope and the second distance is greater than the fourth distance.

12. An apparatus operable to heat a substrate, comprising:
a processing chamber, comprising:
a sidewall defining a processing region;
a first annular lamp array external to the processing region, comprising:
two or more lamp subgroups operable to provide radiant energy to heat a substrate when disposed in the processing region, comprising:
a first lamp subgroup, comprising:
a first plurality of lamps, wherein each lamp of the first plurality of lamps comprises:
a first envelope having a first end and a second end;
a base coupled with the first end of the first envelope to support the first envelope; and
a first filament positioned along a longitudinal axis extending from the first end of the first envelope to the second end of the first envelope, wherein each lamp of the first plurality of lamps has at least one characteristic of the following set of characteristics: the first filament has a first length, an end of the first filament is positioned a first distance from the first end of the first envelope, the first filament has a first number of coils, and the first envelope comprises a first opaque portion positioned a second distance from the first end of the first envelope; and
a first power source coupled with the first plurality of lamps; and
a first lamp driving circuit electrically coupled with the first plurality of lamps in the first lamp subgroup and the first power source and operable to control the first plurality of lamps; and
a second lamp assembly subgroup, comprising:
a second plurality of lamps, wherein each lamp of the second plurality of lamps comprises:
a second envelope having a first end and a second end;
a base coupled with the first end of the second envelope to support the second envelope; and
a second filament positioned along a longitudinal axis extending from the first end of the second envelope to the second end of the second envelope, wherein each lamp of the second plurality of lamps has at least one characteristic of the following set of characteristics: the second filament has a second length, the end of the second filament is positioned a third distance from the first end of the second envelope, the second filament has a second number of coils, and the second envelope comprises a second opaque portion positioned a fourth distance from the first end of the second envelope;
a second power source coupled with the second plurality of lamps; and
a second lamp driving circuit electrically coupled with the second plurality of lamps in the second lamp subgroup and the second power source and operable to control the second plurality of lamps; and a divider positioned between the first annular lamp array and the processing region, wherein the at least one characteristic of the first lamp subgroup differs from the at least one characteristic of the second lamp subgroup; and wherein the first lamp driving circuit is independently controllable relative to the second lamp driving circuit.

13. The apparatus of claim 12, further comprising a second annular lamp array having a third plurality of lamps, wherein the second annular lamp array is concentric with the first annular lamp array.

14. The apparatus of claim 12, wherein the first length is greater than the second length.

15. The apparatus of claim 12, wherein the first envelope comprises the first opaque portion and the first opaque portion is an annular band disposed on the first envelope.

16. The apparatus of claim 15, wherein the second envelope comprises the second opaque portion and the second opaque portion is an annular band disposed on the second envelope and the second distance is greater than the fourth distance.

17. The apparatus of claim 12, wherein a longitudinal axis that passes through the first filament is angled relative to the longitudinal axis that extends from the first end of the first envelope to the second end of the first envelope and a longitudinal axis that passes through the second filament is parallel to the longitudinal axis that extends from the first end of the second envelope to the second end of the second envelope.

18. An apparatus operable to heat a substrate, comprising:
a processing chamber, comprising:
a sidewall defining a processing region;
a first annular lamp array external to the processing region, comprising:
two or more lamp subgroups operable to provide radiant energy to heat a substrate when disposed in the processing region, comprising:
a first lamp subgroup, comprising:
a first plurality of lamps, wherein each lamp of the first plurality of lamps comprises:
a first envelope having a first end and a second end;
a base coupled with the first end of the first envelope to support the first envelope; and
a first filament positioned along a longitudinal axis extending from the first end of the first envelope to the second end of the first envelope, wherein each lamp of the first plurality of lamps has at least one characteristic of the following set of characteristics: the first filament has a first length, an end of the first filament is positioned a first distance from the first end of the first envelope, and the first filament has a first number of coils; and a first power source coupled with the first plurality of lamps; and a first lamp driving circuit electrically coupled with the first plurality of lamps in the first lamp subgroup and the first power source and operable to control the first plurality of lamps; and a second lamp subgroup, comprising:
a second plurality of lamps, wherein each lamp of the second plurality of lamps comprises:
a second envelope having a first end and a second end;
a base coupled with the first end of the second envelope to support the second envelope; and
a second filament positioned along a longitudinal axis extending from the first end of the second envelope to the second end of the second envelope, wherein each lamp of the second plurality of lamps has at least one characteristic of the following set of characteristics: the second filament has a second length, the end of the second filament is positioned a third distance from the first end of the second envelope, and the second filament has a second number of coils;

a second power source coupled with the second plurality of lamps; and a second lamp driving circuit electrically coupled with the second plurality of lamps in the second lamp subgroup and the second power source and operable to control the second plurality of lamps; and a divider positioned between the first annular lamp array and the processing region, wherein the first number of coils is greater than the second number of coils.

19. The apparatus of claim 18, wherein the first length is greater than the second length.

20. The apparatus of claim 18, wherein a longitudinal axis that passes through the first filament is angled relative to the longitudinal axis that extends from the first end of the first envelope to the second end of the first envelope and a longitudinal axis that passes through the second filament is parallel to the longitudinal axis that extends from the first end of the second envelope to the second end of the second envelope.

* * * * *